US008054684B2

(12) United States Patent
Gorobets et al.

(10) Patent No.: US 8,054,684 B2
(45) Date of Patent: Nov. 8, 2011

(54) NON-VOLATILE MEMORY AND METHOD WITH ATOMIC PROGRAM SEQUENCE AND WRITE ABORT DETECTION

(75) Inventors: Sergey Anatolievich Gorobets, Edinburgh (GB); Gautam Ashok Dusija, Milpitas, CA (US)

(73) Assignee: Sandisk Technologies Inc., Plano, TX (US)

( * ) Notice: Subject to any disclaimer, the term of this patent is extended or adjusted under 35 U.S.C. 154(b) by 54 days.

(21) Appl. No.: 12/642,740

(22) Filed: Dec. 18, 2009

(65) Prior Publication Data

US 2011/0149651 A1 Jun. 23, 2011

(51) Int. Cl.
G11C 11/34 (2006.01)

(52) U.S. Cl. ............... 365/185.03; 365/185.24

(58) Field of Classification Search ............. 365/185.03, 365/185.24
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |
| 5,903,495 A | 5/1999 | Takeuchi et al. |
| 6,011,287 A | 1/2000 | Itoh et al. |
| 6,046,935 A | 4/2000 | Takeuchi et al. |
| 6,076,138 A | 6/2000 | Shin |
| 6,222,762 B1 | 4/2001 | Guterman et al. |
| 6,657,891 B1 | 12/2003 | Shibata et al. |
| 6,988,175 B2 | 1/2006 | Lasser |
| 7,046,548 B2 | 5/2006 | Cernea et al. |
| 7,240,178 B2 | 7/2007 | Nakada et al. |
| 7,856,538 B2 * | 12/2010 | Speirs et al. .................. 711/152 |
| 2001/0033656 A1 * | 10/2001 | Gligor et al. .................... 380/28 |
| 2005/0144362 A1 | 6/2005 | Lin et al. |
| 2008/0065818 A1 | 3/2008 | Lin et al. |
| 2010/0172180 A1 | 7/2010 | Paley et al. |
| 2011/0099460 A1 | 4/2011 | Dusija et al. |
| 2011/0153912 A1 | 6/2011 | Gorobets et al. |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
EPO/ISA, "Notification of Transmittal of the International Search Report and the Written Opinion of the International Searching Authority, or the Declaration," corresponding International Patent Application No. PCT/US2010/060778, mailed on Mar. 25, 2011, 10 pages.

* cited by examiner

Primary Examiner — Michael Tran
(74) Attorney, Agent, or Firm — Davis Wright Tremaine LLP

(57) ABSTRACT

A program operation in a non-volatile memory is segmented at predefined junctures into smaller segments for execution over different times. The predefined junctures are such that they allow unambiguous identification when restarting the operation in a next segment so that the operation can continue without having to restart from the very beginning of the operation. This is accomplished by requiring the programming sequence of each segment to be atomic, that is, to only terminate at a predetermined type of programming step. In a next segment, the terminating programming step is identified by detecting a predetermined pattern of ECC errors across a group of programmed wordlines.

13 Claims, 21 Drawing Sheets

Programming into four states represented by a 3-bit code

Programming into two states represented by a 1-bit code

FIG. 8 Programming into four states represented by a 3-bit code

Logical Page Programming Sequence for D2 to Minimize WL-WL Floating-gate Coupling Effect

Logical Pages Programmed into D3

| STEP Sn | MEMORY ARRAY | WLm |
|---|---|---|
| ↑ | . . . . | . . . . |
| S16 | LP(6.0) | WL6 |
| S17 / S13 | LP(5.0), LP(5.1), LP(5.2) / ~~LP(5.0), LP(5.1), LP(5.2)~~ / LP(5.0) | WL5 |
| S18 / S14 / S10 | LP(4.0), LP(4.1), LP(4.2) / ~~LP(4.0), LP(4.1), LP(4.2)~~ / LP(4.0) | WL4 |
| S15 / S11 / S7 | LP(3.0), LP(3.1), LP(3.2) / ~~LP(3.0), LP(3.1), LP(3.2)~~ / LP(3.0) | WL3 |
| S12 / S8 / S4 | LP(2.0), LP(2.1), LP(2.2) / ~~LP(2.0), LP(2.1), LP(2.2)~~ / LP(2.0) | WL2 |
| S9 / S5 / S2 | LP(1.0), LP(1.1), LP(1.2) / ~~LP(1.0), LP(1.1), LP(1.2)~~ / LP(1.0) | WL1 |
| S6 / S3 / S1 | LP(0.0), LP(0.1), LP(0.2) / ~~LP(0.0), LP(0.1), LP(0.2)~~ / LP(0.0) | WL0 |
| Programming Order | Logical Page | Wordline |

**Programming Sequence for D3
and program data needed for each step**

*FIG. 11B*

| | Programming Step | | |
|---|---|---|---|
| | Lower pass | Foggy pass | Fine pass |
| WL0 | S1 : LP(0.0) | S3 : LP(0.0), LP(0.1), LP(0.2) | S6 : LP(0.0), LP(0.1), LP(0.2) |
| WL1 | S2 : LP(1.0) | S5 : LP(1.0), LP(1.1), LP(1.2) | S9 : LP(1.0), LP(1.1), LP(1.2) |
| WL2 | S4 : LP(2.0) | S8 : LP(2.0), LP(2.1), LP(2.2) | S12 : LP(2.0), LP(2.1), LP(2.2) |
| WL3 | S7 : LP(3.0) | S11 : LP(3.0), LP(3.1), LP(3.2) | S15 : LP(3.0), LP(3.1), LP(3.2) |
| WL4 | S10 : LP(4.0) | S14 : LP(4.0), LP(4.1), LP(4.2) | S18 : LP(4.0), LP(4.1), LP(4.2) |
| WL5 | S13 : LP(5.0) | S17 : LP(5.0), LP(5.1), LP(5.2) | |
| WL6 | S16 : LP(6.0) | | |

Programming Sequence for D3 and program data needed for each step

FIG. 11C

Preferred Host Page Storage Order in D3

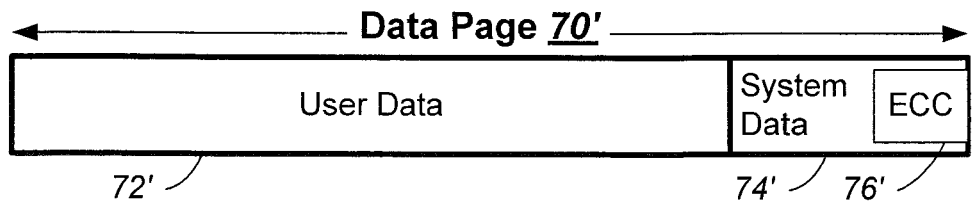

FIG. 13A

| PAGE STATUS | DESCRIPTION |
| --- | --- |
| CECC | Correctable by ECC. The number of errors in all 3 data pages is correctable as it is within the capability of the ECC. However, the quality of the data is good only if the errors are above a predetermine threshold. |
| UECC | Uncorrectable by ECC. The number of errors either exceeds the capability of the ECC or above the predetermined threshold even though still correctable by ECC. The data is invalid. |
| Good or Valid | All 3 data pages of the wordline have errors correctable by ECC and below a predetermined threshold. The data is valid. |
| Erased | No data page has more than a predetermined number of cells in non-erased state. |

FIG. 13B

Example of D1 to D3 Folding

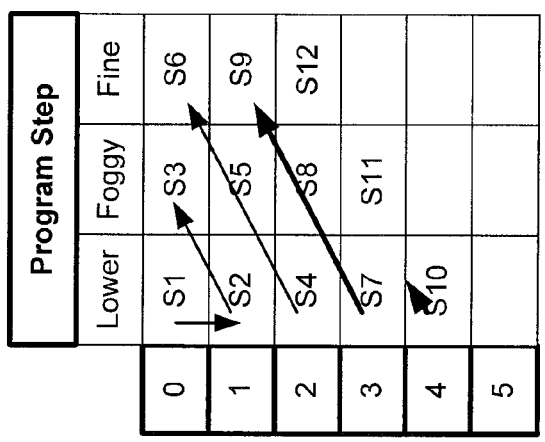

| WL | Event | | | | |
|---|---|---|---|---|---|
| | Lower, S10 | | | | |
| | Aborted near start | Aborted in the middle | Aborted near end | Complete | |
| 0 | Good D3 | Good D3 | Good D3 | Good D3 | |
| 1 | Good D3 | UECC | UECC | Good D3 | |
| 2 | UECC | UECC | UECC | UECC | |
| 3 | UECC | UECC | UECC | UECC | |
| 4 | Erased | Erased | UECC | UECC | |
| 5 | Erased | Erased | Erased | Erased | |

| Pattern detection result | Complete Atomic Write | Write Abort | Write Abort | Write Abort |
|---|---|---|---|---|
| Data State | LP incomplete but will be fixed later | Invalid | Invalid | Invalid |

Atomic write ending in a Fine Pass

FIG. 16B

| | Program Step | | |
|---|---|---|---|
| | Lower | Foggy | Fine |
| 0 | S1 | S3 | S6 |
| 1 | S2 | S5 | S9 |
| 2 | S4 | S8 | S12 |
| 3 | S7 | S11 | |
| 4 | S10 | | |
| 5 | | | |

FIG. 15

| | Lower, S7 | Foggy, S8 | | | | Fine, S9 | | | |
|---|---|---|---|---|---|---|---|---|---|
| Event | Complete | Aborted near start | Aborted in the middle | Aborted near end | Complete | Aborted near start | Aborted in the middle | Aborted near end | Complete |
| WL0 | | Good D3 | Good D3 | Good D3 | Good D3 | Good D3 | Good D3 | Good D3 | Good D3 |
| WL1 | Good D3 | UECC | UECC | UECC | UECC | UECC | UECC | Good D3 | Good D3 |
| WL2 | UECC | UECC | UECC | UECC | UECC | UECC | UECC | UECC | UECC |
| WL3 | UECC | UECC | UECC | UECC | UECC | UECC | UECC | UECC | UECC |
| WL4 | Erased | Erased | Erased | Erased | Erased | Erased | Erased | Erased | Erased |
| WL5 | Erased | Erased | Erased | Erased | Erased | Erased | Erased | Erased | Erased |
| Pattern detection result | Write Abort | Write Abort | Write Abort | Write Abort | Write Abort | Write Abort | Write Abort | Complete Atomic Write | Complete Atomic Write |
| Data State | Invalid | Invalid | Invalid | Invalid | Invalid | Invalid | Invalid | Marginal valid | D3 data is good |

Atomic write ending in a Fine Pass

*FIG. 16A*

| | Lower, S7 | Foggy, S8 | | | | Fine, S9 | | | |
|---|---|---|---|---|---|---|---|---|---|
| Event | Complete | Aborted near start | Aborted in the middle | Aborted near end | Complete | Aborted near start | Aborted in the middle | Aborted near end | Complete |
| WL0 | Good D3 | Good D3 | Good D3 | Good D3 | Good D3 | Good D3 | Good D3 | Good D3 | Good D3 |
| WL1 | UECC | UECC | UECC | UECC | UECC | UECC | UECC | UECC | Good D3 |
| WL2 | Good LP | Good LP | UECC | UECC | UECC | UECC | UECC | UECC | UECC |
| WL3 | Good LP | Good LP | Good LP | Good LP | Good LP | Good LP | Good LP | Good LP | Good LP |
| WL4 | Erased | Erased | Erased | Erased | Erased | Erased | Erased | Erased | Erased |
| WL5 | Erased | Erased | Erased | Erased | Erased | Erased | Erased | Erased | Erased |
| Pattern detection result | Complete Atomic Write | Complete Atomic Write | Write Abort | Write Abort | Write Abort | Write Abort | Write Abort | Write Abort | Write Abort |
| Data State | LP data is good | Foggy data incomplete but will be fixed later | Invalid | Invalid | Invalid | Invalid | Invalid | Invalid | Invalid |

Atomic write ending in a Lower Pass

FIG. 17A

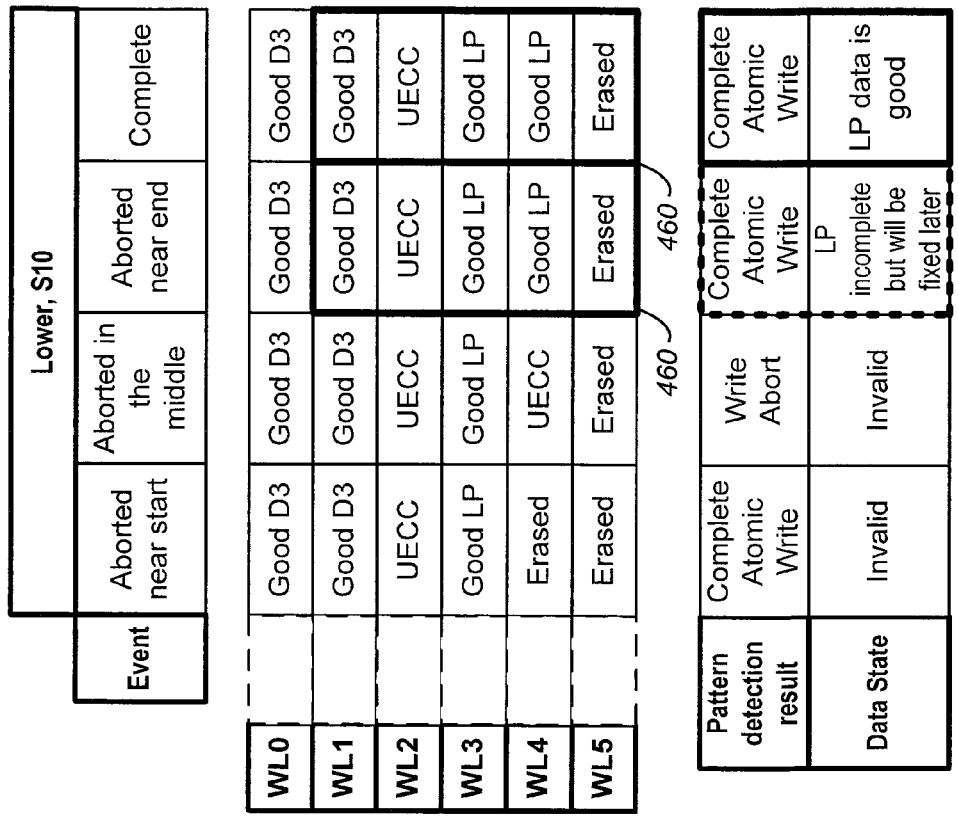
FIG. 17B  Atomic write ending in a Lower Pass

Atomic Program Sequence

Identifying the Last Program Step

NON-VOLATILE MEMORY AND METHOD WITH ATOMIC PROGRAM SEQUENCE AND WRITE ABORT DETECTION

BACKGROUND OF THE INVENTION

This application relates to the operation of re-programmable non-volatile memory systems such as semiconductor flash memory, and, more specifically, to handling programming suspensions and restarts.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states per storage element, are also being implemented. Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Errors in Written Data

In the types of memory systems described herein, as well as in others, including magnetic disc storage systems, the integrity of the data being stored is maintained by use of an error correction technique. Most commonly, an error correction code (ECC) is calculated for each sector or other unit of data that is being stored at one time, and that ECC is stored along with the data. The ECC is most commonly stored together with a unit group of user data from which the ECC has been calculated. The unit group of user data may be a sector or a multi-sector page. When this data is read from the memory, the ECC is used to determine the integrity of the user data being read. Erroneous bits of data within the unit group of data can often be corrected by use of the ECC.

The trend is to reduce the size of the memory systems in order to be able to put more memory cells in the system and to make the system as small as possible to fit in smaller host devices. Memory capacity is increased by a combination of higher integration of circuits and configuring each memory cell to store more bits of data. Both techniques require the memory to operate with increasing tighter margin of error. This in turn places more demand on the ECC to correct errors. The ECC can be designed to correct a predetermined number of error bits. The more bits it has to correct, the more complex and computationally intensive will the ECC be.

A non-volatile memory typically operates with a host to store and retrieve data. For proper and efficient operations, it also needs to perform many internal memory operations such as copying data between different portions of the memory. These internal operations can be performed in the background while the host is idle but are preferably performed in the foreground by piggy-backing to a host operation to avoid the chance of unexpected power shutdown. For example, during each host write command, not all the time budgeted for the host write command is used up to do the host write. The spare time could be used to perform some of the internal memory operations. Since an internal memory operation may take longer than the spare time afforded in a single host command, it may need to be performed over several host commands. Thus, there is a need to break up the internal memory operation into smaller segments in order to execute them over the spare times afforded by several host commands.

Current generation of non-volatile memory has multi-bit data programmable through each wordline using a set of multiple types of programming passes. A preferred set has the characteristics that some or all of the multi-bits data programmed are not valid until all passes of the set have completed. A program operation over a group of wordlines typically includes a series of programming steps, each step performing a different type of programming pass on a different wordline from the last step. When a program operation is broken up into smaller segments to be executed over different times, the terminating programming step in a last segment needs to be identified in the next segment in order for the program operation to restart and continue from. However, with indefinite memory states in between programming passes and non-sequential wordline programming order, the last programming step often cannot be clearly discovered in the next segment.

Thus, there is a need to provide a nonvolatile memory with a programming technique that allow a program operation to be segmented and executed over different times while amenable to providing continuity from one segment to the next.

SUMMARY OF THE INVENTION

According to a general aspect of the invention, a program operation in a non-volatile memory is segmented at predefined junctures into small segments for execution over different times. The predefined junctures are such that they allow unambiguous identification when restarting the operation in a next segment so that the operation can continue without having to restart from the very beginning of the operation. This is accomplished by requiring the programming sequence of each segment to be atomic, that is, to only terminate at a predetermined type of programming step. In a next segment, the terminating programming step is identified by detecting a predetermined pattern of ECC errors across a group of programmed wordlines.

According to one aspect of the invention, the atomic programming sequence is provided in the following non-volatile memory. The non-volatile memory has multi-bit data programmable through each wordline using a set of multiple types of programming passes. A program operation over a group of wordlines typically includes a series of programming steps, each step performing a different type of programming pass on a different wordline from the last step. The program operation is allowed to be broken up into smaller segments with the programming step at each segment terminating only at a predetermined type among of the set multiple types of programming passes. The predetermined type is one that would allow the terminating programming step to be identified as compared to other types of the set that would not. With the atomic program sequence terminating at the predetermined type of programming pass, the terminating programming step can be unambiguous identified in a next segment in order to restart and continue the operation therefrom.

In a preferred embodiment, a page of 3-bit memory cells on a wordline is programmed by three types of programming passes, namely, Lower, Foggy and Fine. In one specific embodiment, the atomic program sequence terminates on a programming step executing the Lower pass. In another specific embodiment, the atomic program sequence terminates on a programming step executing the Fine pass.

According to another aspect of the invention, the terminating programming step in a segment is identified in a next segment by detecting a predetermined pattern of ECC errors across a group of programmed wordlines.

In a preferred embodiment, the terminating programming step of a last segment is identified in a next segment. A boundary between programmed and erased wordlines is located by a binary search. The ECC errors of a group of programmed wordlines from the boundary form a detectable ECC pattern or signature to allow identification of a wordline the last programming step terminated on in the last segment. Given the identified wordline and the type of terminating pass of the atomic program sequence, the last programming step is determined for the program operation to restart and continue on.

BRIEF DESCRIPTION OF THE DRAWINGS

FIG. 11B illustrates an example of a memory having 3-bit memory cells (D3) and with its pages programmed in a optimal sequence so as to minimize the Yupin effect between memory cells on adjacent word lines.

FIG. 11C illustrates another view of the programming order for the 3-bit memory of FIG. 11B.

FIG. 12A illustrates an example of a preferred ordering of pages in sequential host addresses.

FIG. 13A illustrates schematically a data page containing an ECC field.

FIG. 13B is a table illustrating the possible status of a page in D3.

FIG. 15 illustrates the programming steps of FIG. 11B up to S10.

FIGS. 16A and 16B list the effect of a write abort at various junctures of the programming steps S7-S10.

FIGS. 17A and 17B also list the effect of a write abort at various junctures of the programming steps S7-S10.

DETAILED DESCRIPTION

Memory System

Figure 1:
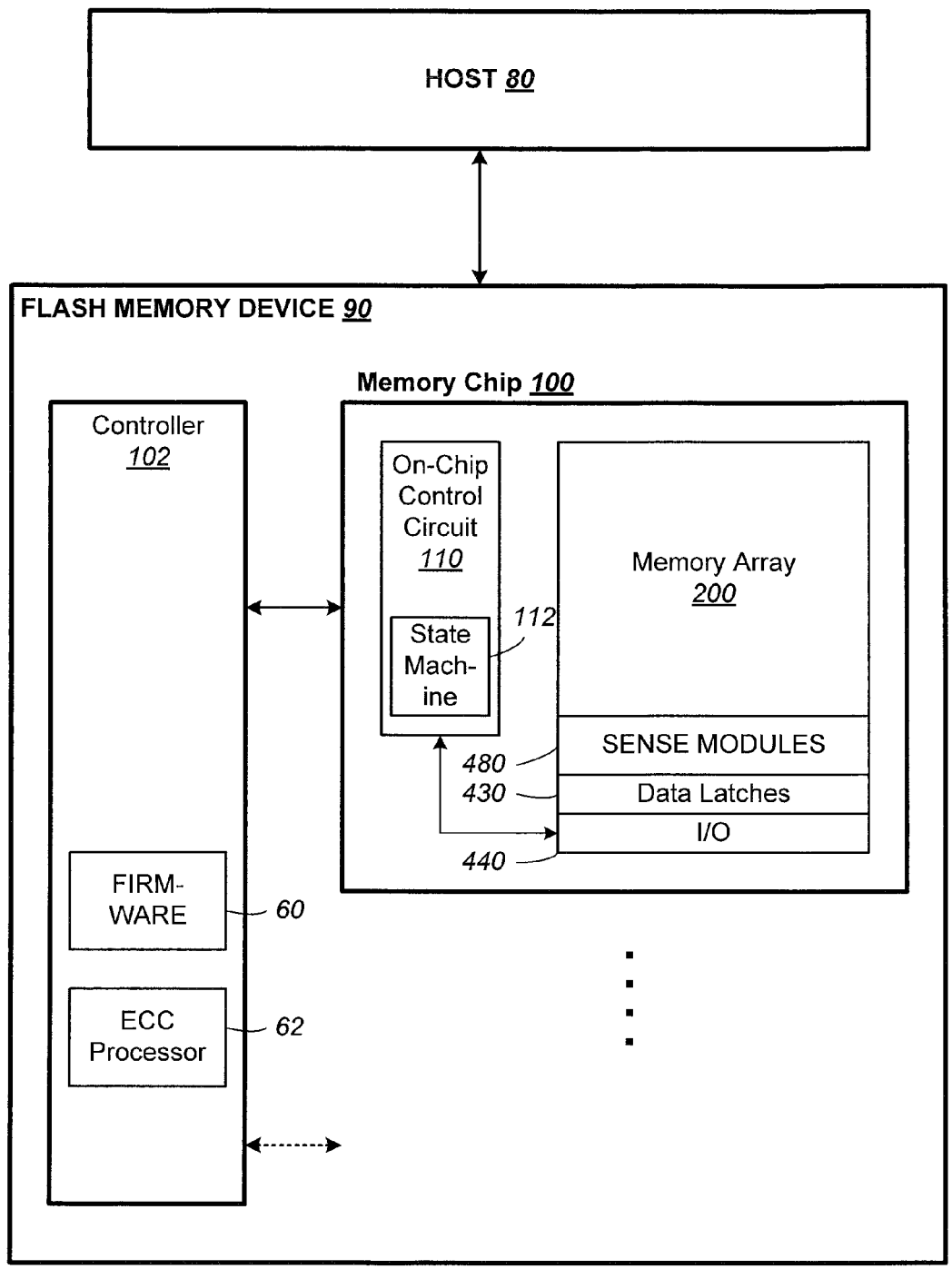
FIG. 1 illustrates a host in communication with a memory device in which the features of the present invention are embodied.

FIG. 1 illustrates a host in communication with a memory device in which the features of the present invention are embodied. The host 80 typically sends data to be stored at the memory device 90 or retrieves data by reading the memory device 90. The memory device 90 includes one or more memory chip 100 managed by a controller 102. The memory chip 100 includes a memory array 200 of memory cells with each cell capable of being configured as a multi-level cell ("MLC") for storing multiple bits of data. The memory chip also includes peripheral circuits such as sense modules 480, data latches 430 and I/O circuits 440. An on-chip control circuitry 110 controls low-level memory operations of each chip. The control circuitry 110 is an on-chip controller that cooperates with the peripheral circuits to perform memory operations on the memory array 200. The control circuitry 110 typically includes a state machine 112 to provide chip level control of memory operations.

In many implementations, the host 80 communicates and interacts with the memory chip 100 via the controller 102. The controller 102 co-operates with the memory chip and controls and manages higher level memory operations. For example, in a host write, the host 10 sends data to be written to the memory array 100 in logical sectors allocated from a file system of the host's operating system. A memory block management system implemented in the controller stages the sectors and maps and stores them to the physical structure of the memory array.

A preferred block management system is disclosed in U.S. application Ser. No. 12/348,891, filed on 1 Jan. 2009, U.S. Patent Publication No. 2010/0172180 A1, the entire disclosure of which is incorporated herein by reference.

A firmware 60 provides codes to implement the functions of the controller 102. An error correction code ("ECC") processor 62 processes ECC during operations of the memory device. In another embodiment, the controller 102 is implemented within the host.

Physical Memory Structure

Figure 2:
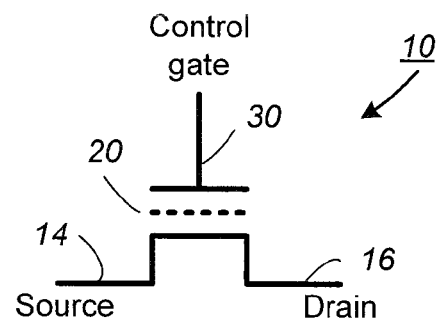
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element. Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, Nov. 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Conversely, a threshold voltage is defined as the voltage on the control gate that will just turn on the cell with the given charge. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line or a known capacitor.

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

The memory array 200 is typically organized as a two-dimensional array of memory cells arranged in rows and columns and addressable by word lines and bit lines. The array can be formed according to an NOR type or an NAND type architecture.

Figure 3:
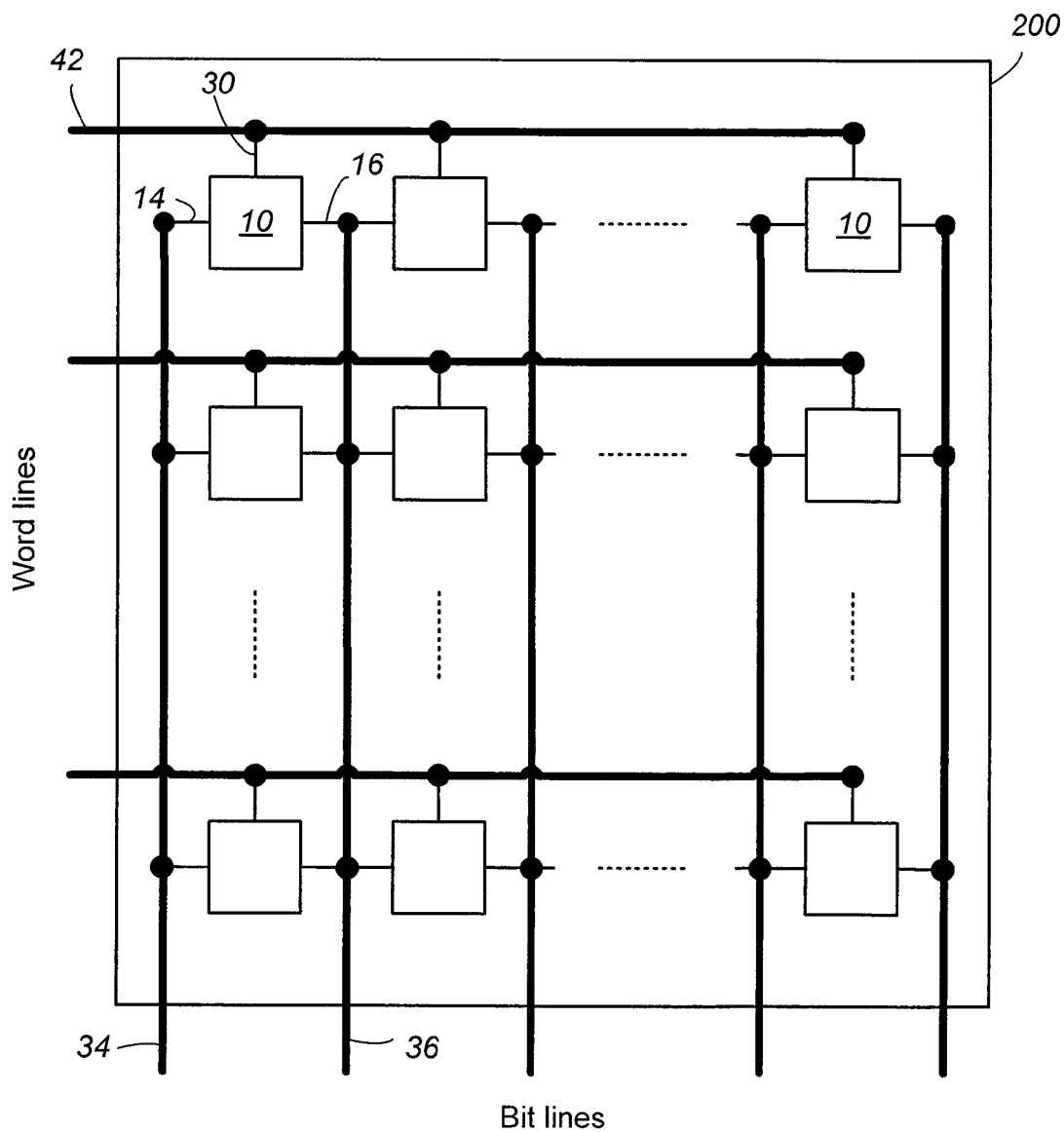
FIG. 3 illustrates an example of an NOR array of memory cells.

FIG. 3 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 4:
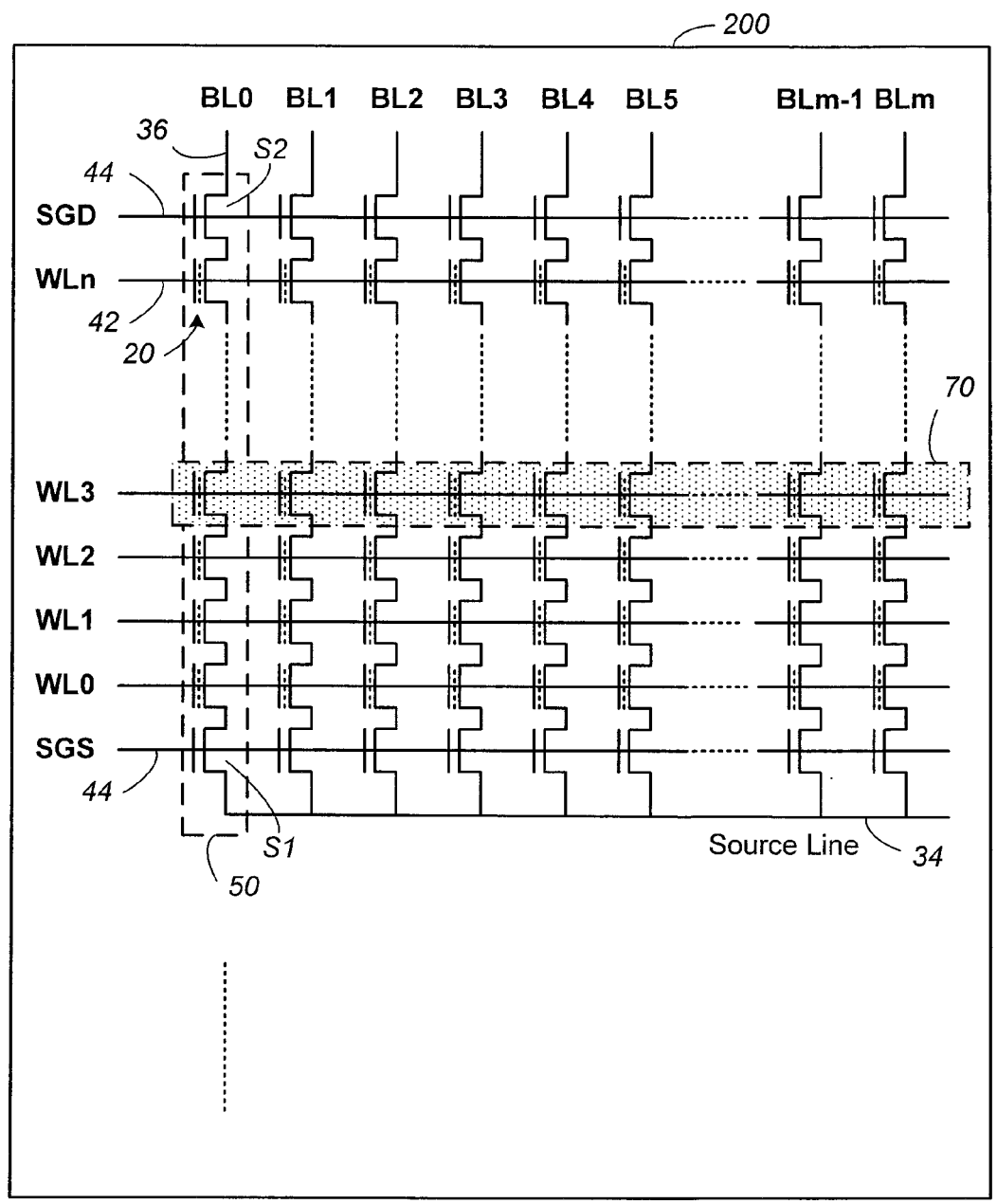
FIG. 4 illustrates a page of memory cells, organized for example in the NAND configuration, being sensed or programmed in parallel.

FIG. 4 illustrates a page of memory cells, organized for example in the NAND configuration, being sensed or programmed in parallel. FIG. 4 essentially shows a bank of NAND strings 50 in the memory array 200. A NAND string 50 comprises of a series of memory transistors (e.g., 4, 8, 16 or higher) daisy-chained by their sources and drains. A pair of select transistors S1, S2 controls the memory transistors chain's connection to the external via the NAND string's source terminal and drain terminal respectively. In a memory array, when the source select transistor Si is turned on, the source terminal is coupled to a source line 34. Similarly, when the drain select transistor S2 is turned on, the drain terminal of the NAND string is coupled to a bit line 36 of the memory array. Each memory transistor 10 in the chain acts as a memory cell. It has a charge storage element 20 to store a given amount of charge so as to represent an intended memory state. A control gate of each memory transistor allows control over read and write operations. The control gates of corresponding memory transistors of a row of NAND string are all connected to the same word line (such as WL0, WL1, . . . ) Similarly, a control gate of each of the select transistors S1, S2 (accessed via select lines SGS and SGD respectively) provides control access to the NAND string via its source terminal and drain terminal respectively.

When an addressed memory transistor 10 within an NAND string is read or is verified during programming, its control gate is supplied with an appropriate voltage via a common word line. At the same time, the rest of the non-addressed memory transistors in the NAND string 50 are fully turned on by application of sufficient voltage on their control gates. In this way, a conductive path is effective created from the source of the individual memory transistor to the source terminal of the NAND string and likewise for the drain of the individual memory transistor to the drain terminal of the cell. Memory devices with such NAND string structures are described in U.S. Pat. Nos. 5,570,315, 5,903,495, 6,046,935.

A "page" such as the page 70, is a group of memory cells enabled to be sensed or programmed in parallel. This is accomplished by a corresponding page of sense amplifiers. For example, the page 70 is along a row and is sensed by a sensing voltage applied to the control gates of the cells of the page connected in common to the word line WL3. Along each column, each cell such as cell 10 is accessible by a sense amplifier via a bit line 36. The page referred to above is a physical page memory cells or sense amplifiers. Depending on context, in the case where each cell is storing.

Sensing Circuits and Techniques

Figure 5A:
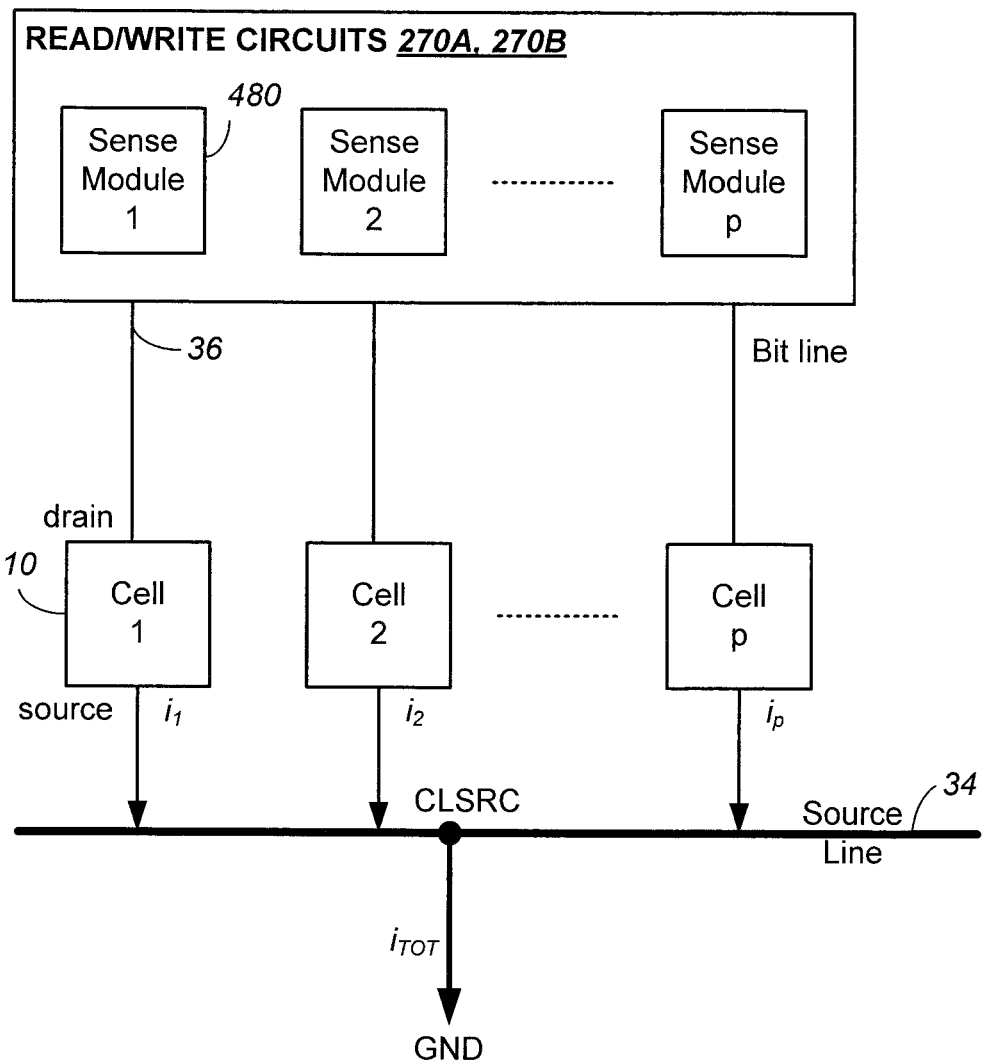
FIG. 5A illustrates in more detail the sense modules shown in FIG. 1 to contain a bank of p sense modules across an array of memory cells.

FIG. 5A illustrates in more detail the sense modules shown in FIG. 1 to contain a bank of p sense modules across an array of memory cells. The entire bank of p sense modules 480 operating in parallel allows a group (or physical page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{TOT}$ for the page flowing out of the source line 34 into an aggregate node CLSRC and from there to ground will be a summation of all the currents in the p cells.

In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A physical page of sensing circuits is coupled to either the even bit lines or to the odd bit lines at any one time.

In currently produced chips, the physical page may be 64 k or larger. In the preferred embodiment, the group is a run of the entire row of cells. This is the so-called "all bit-line" architecture in which the page is constituted from a row of contiguous memory cells coupled respectively to contiguous bit lines.

Figure 5B:
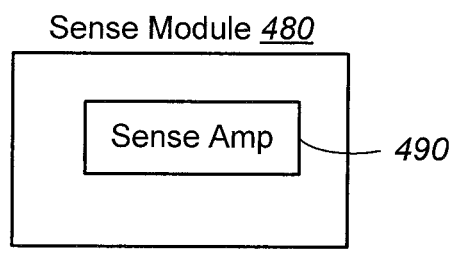
FIG. 5B illustrates a sense module including a sense amplifier.

FIG. 5B illustrates a sense module including a sense amplifier. The sense amplifier 490 detects the conduction current of a cell is above or below a reference level. The sensed results are latches in a corresponding set of latches 430 (see FIG. 1).

Erase Blocks

One important difference between flash memory and other type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together.

Figure 6:
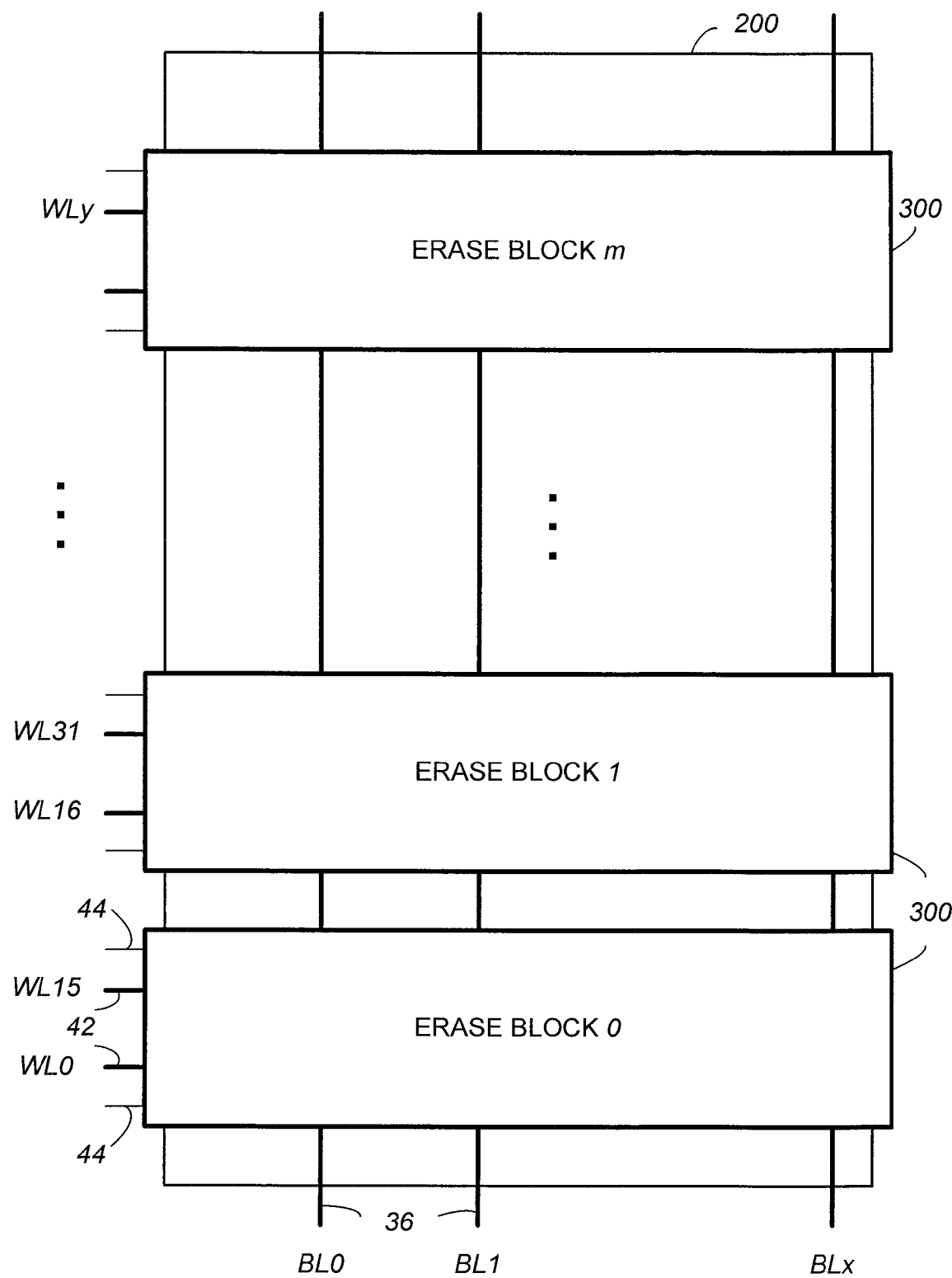
FIG. 6 illustrates schematically an example of a memory array organized in erasable blocks.

FIG. 6 illustrates schematically an example of a memory array organized in erasable blocks. Programming of charge storage memory devices can only result in adding more charge to its charge storage elements. Therefore, prior to a program operation, existing charge in charge storage element of a memory cell must be removed (or erased). A non-volatile memory such as EEPROM is referred to as a "Flash"

EEPROM when an entire array of cells 200, or significant groups of cells of the array, is electrically erased together (i.e., in a flash). Once erased, the group of cells can then be reprogrammed. The group of cells erasable together may consist of one or more addressable erase unit 300. The erase unit or block 300 typically stores one or more pages of data, the page being a minimum unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

In the example shown in FIG. 6, individual memory cells in the memory array 200 are accessible by word lines 42 such as WL0-WLy and bit lines 36 such as BL0-BLx. The memory is organized into erase blocks, such as erase blocks 0, 1, . . . m. Referring also to FIGS. 5A and 5B, if the NAND string 50 contains 16 memory cells, then the first bank of NAND strings in the array will be accessible by select lines 44 and word lines 42 such as WL0 to WL15. The erase block 0 is organized to have all the memory cells of the first bank of NAND strings erased together. In memory architecture, more than one bank of NAND strings may be erased together.

Examples of Binary (SLC) and Multi-state (MLC) Memory Partitioning

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits.

Figure 7:
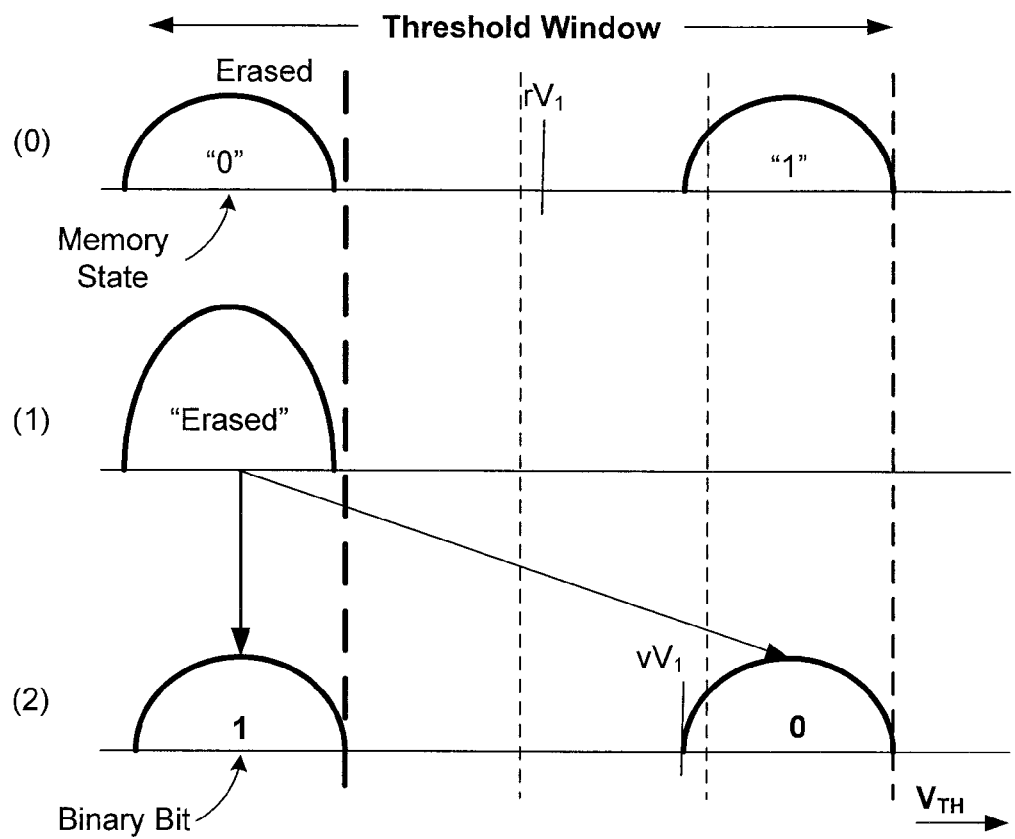
FIG. 7 illustrates a binary memory having a population of cells with each cell being in one of two possible states.

FIG. 7 illustrates a binary memory having a population of cells with each cell being in one of two possible states. Each memory cell has its threshold window partitioned by a single demarcation level into two distinct zones. As shown in FIG. 7(0), during read, a read demarcation level $rV_1$, between a lower zone and an upper zone, is used to determine to which zone the threshold level of the cell lies. The cell is in an "erased" state if its threshold is located in the lower zone and is in a "programmed" state if its threshold is located in the upper zone. FIG. 7(1) illustrates the memory initially has all its cells in the "erased" state. FIG. 7(2) illustrates some of cells being programmed to the "programmed" state. A 1-bit or binary code is used to code the memory states. For example, the bit value "1" represents the "erased" state and "0" represents the "programmed" state. Typically programming is performed by application of one or more programming voltage pulse. After each pulse, the cell is sensed to verify if the threshold has moved beyond a verify demarcation level $vV_1$. A memory with such memory cell partitioning is referred to as "binary" memory or Single-level Cell ("SLC") memory. It will be seen that a binary or SLC memory operates with a wide margin of error as the entire threshold window is only occupied by two zones.

Figure 8:
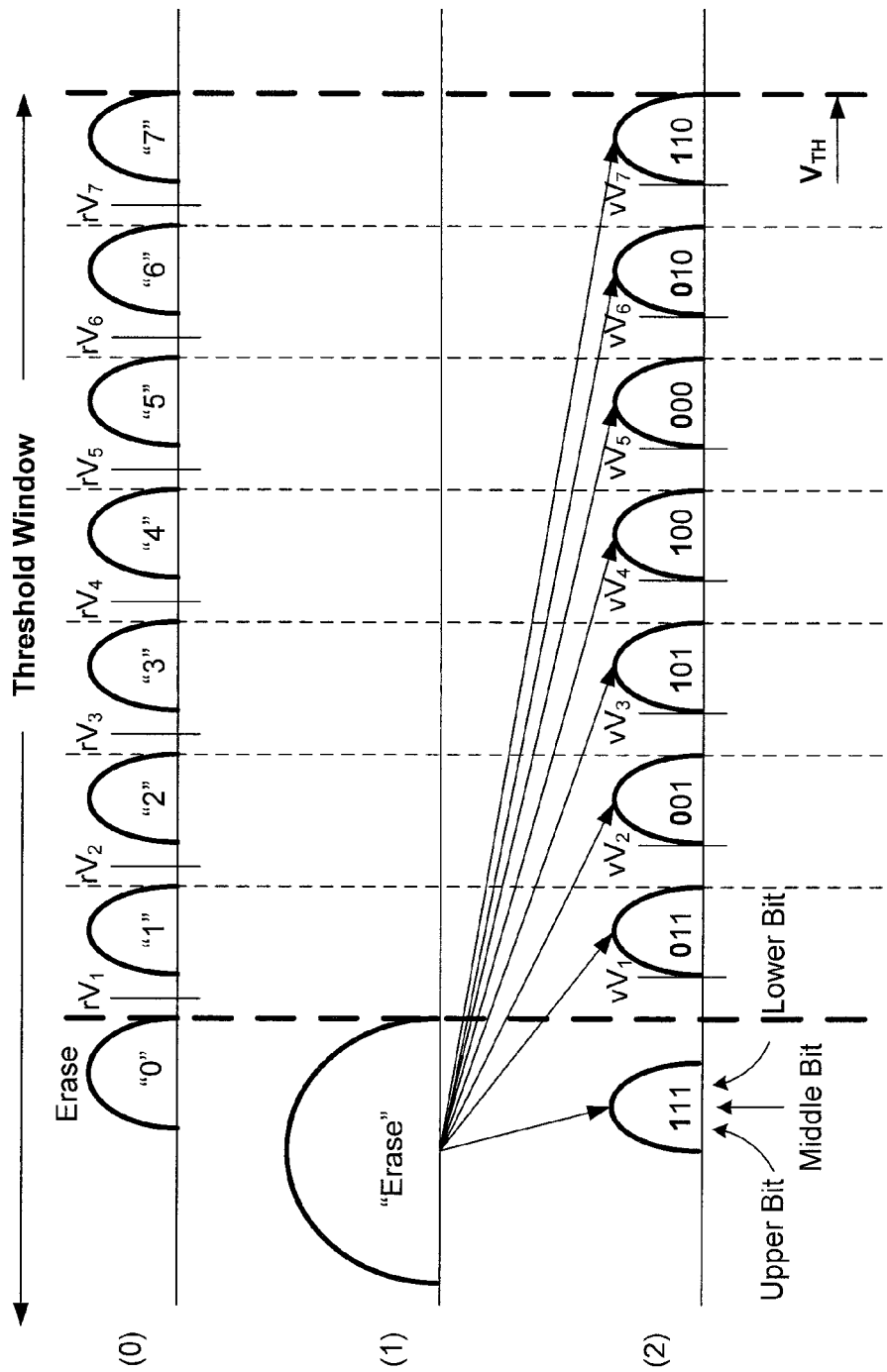
FIG. 8 illustrates a multi-state memory having a population of cells with each cell being in one of eight possible states.

FIG. 8 illustrates a multi-state memory having a population of cells with each cell being in one of eight possible states. Each memory cell has its threshold window partitioned by at least seven demarcation levels into eight distinct zones. As shown in FIG. 8(0), during read, read demarcation levels $rV_1$ to $rV_7$ are used to determine to which zone the threshold level of the cell lies. The cell is in an "erased" state if its threshold is located in the lowest zone and is in one of multiple "programmed" states if its threshold is located in the upper zones. FIG. 8(1) illustrates the memory initially has all its cells in the "erased" state. FIG. 8(2) illustrates some of cells being programmed to the "programmed" state. A 3-bit code having lower, middle and upper bits can be used to represent each of the eight memory states. For example, the "0", "1", "2", "3", "4", "5", "6" and "7" states are respectively represented by "111", "011", "001", "101', "100", "000", "010" and '110". Typically programming is performed by application of one or more programming voltage pulses. After each pulse, the cell is sensed to verify if the threshold has moved beyond a reference which is one of verify demarcation levels $vV_1$ to $vV_7$. A memory with such memory cell partitioning is referred to as "multi-state" memory or Multi-level Cell ("MLC") memory.

Similarly, a memory storing 4-bit code will have lower, first middle, second middle and upper bits, representing each of the sixteen states. The threshold window will be demarcated by at least 15 demarcation levels into sixteen distinct zones.

As the memory's finite threshold window is partitioned into more regions, the resolution for programming and reading will necessarily become finer. Thus, a multi-state or MLC memory necessarily operates with a narrower margin of error compared to that of a memory with less partitioned zones. In other words, the error rate increases with the number of bits stored in each cell. In general, error rate increases with the number of partitioned zones in the threshold window.

Floating Gate-to-Floating Gate Coupling (the "Yupin Effect")

The charge programmed into the charge storage element of one memory cell produces an electric field that perturbs the electric field of a neighboring memory cell. If a memory cell is program-verified under a first field environment and later is read again under a different field environment due to neighboring cells subsequently being programmed with different charges, the read accuracy may be affected by what is referred to as a floating-gate-to-floating gate coupling or the "Yupin Effect". With ever higher integration in semiconductor memories, the perturbation of the electric field due to the stored charges between memory cells (Yupin effect) becomes increasing appreciable as the inter-cellular spacing shrinks The Yupin effect can be mitigated by minimizing the asymmetry in field environment for a cell between the time of program-verifying and a time of reading subsequent to the neighboring cells have been programmed. This problem affects adjacent cells along a row and across bit lines (BL-BL Yupin effect) and along a column across word lines (WL-WL Yupin effect) of a memory array.

One way to reduce BL-BL Yupin effect is to perform multi-pass programming that avoids large change in charges between each pass of programming.

Figure 9:
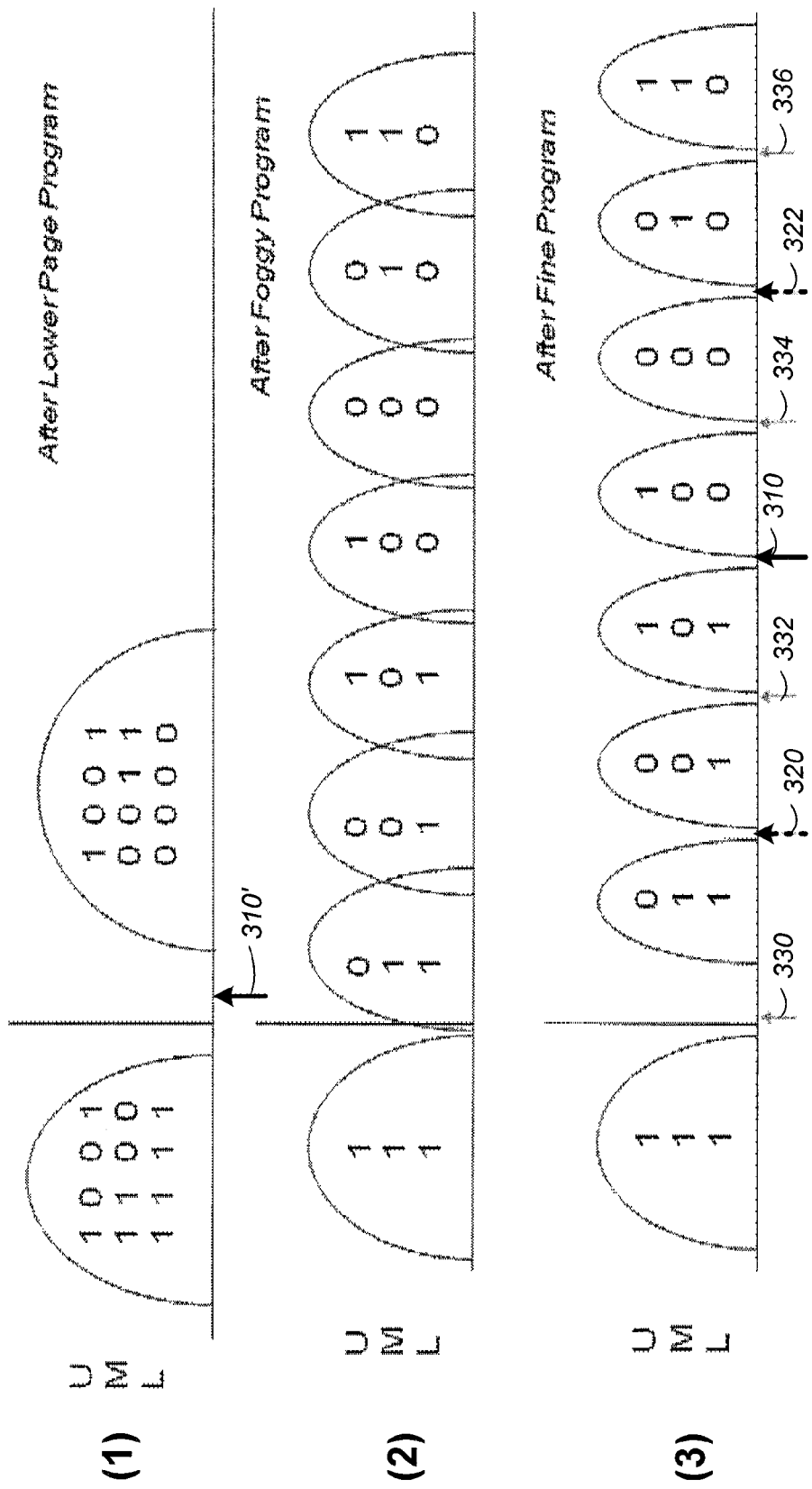
FIGS. 9(1)-9(3) illustrate a preferred (Foggy-fine) multi-pass programming for programming three bits of data into each memory cell of a page on a word line.

FIGS. 9(1)-9(3) illustrate a preferred (Foggy-fine) multi-pass programming for programming three bits of data into each memory cell of a page on a word line. There are 3 programming pass of the types: Lower; Foggy; and Fine:

FIG. 9(1) illustrates a Lower (or First) page programming pass. This is a function of lower page data only. Although the data from this program pass looks like Binary, the data may or may not be readable back reliably due to memory design limitations. As can be seen from FIG. 9(3), the normal demarcation point for the lower page read is a demarcation 310. In order to read the binary data after the Lower pass, an alternative read demarcation 310' will be needed.

FIG. 9(2) illustrates a Foggy page programming pass. This is a function of all 3 pages' data. This is an intermediate pass which ends up with cell having overlapping program levels, so that the data cannot be read back reliably.

FIG. 9(3) illustrates a Fine page programming pass. This is also a function of all 3 pages' data. This is the final programming pass of the wordline. After Fine program, data is readable for all 3 data pages. The lower ("0") logical page has read demarcation point 310. The middle ("1") logical page has read demarcations points 320 and 322. The upper ("2") logical page has read demarcation points 330, 332, 334 and 336.

In will be seen that data programmed by this "foggy-fine" multi-pass programming scheme is only readable after the final, Fine programming pass is completed. After the Foggy pass, no data is readable. After the Lower pass, data is only readable if the demarcation read threshold is changed from the normal demarcation 310 to the alternative demarcation 310'. If the memory does not support an alternative lower page read demarcation, the lower page data is also not readable just after the Lower pass.

Similar multi-passing programming techniques have been disclosed in U.S. Pat. No. 6,657,891 and U.S. Pat. No. 7,046,548.

Yupin Effect Between Word lines

One way to reduce WL-WL Yupin effect is to program the pages in the memory array in an optimal order.

As for WL-WL Yupin effect where the perturbations are between memory cells on adjacent word lines, it can be mitigated during programming using a preferred programming scheme. This will effectively reduce the perturbation by half. The remaining half can also be corrected during read by using a preferred "Look-Ahead" reading scheme.

A preferred programming scheme would have the pages associated with the word lines programmed in an optimal sequence. For example, in the case of binary memory where every physical page holds a page of binary data, the pages are preferably programmed sequentially along a consistent direction, such as from bottom to top. In this way, when a particular page is being programmed, the pages on the lower side of it are already programmed. Whatever perturbative effects they may have on the current page, they are being accounted for as the current page is being program-verified in view of these perturbations. Essentially, the sequence of the programming the page should allow the current page being programmed to see a minimum of changes around its environment after it has been programmed. Thus, each programmed page is only perturbed by the pages on the upper side of it and the WL-WL Yupin effect is effectively reduced in half by this programming sequence.

In the case of a memory where each physical page of memory cells is multi-state and the resulting multiple logical data pages are programmed in different passes, the sequence is less straight forward.

Figures 10A, 10B:
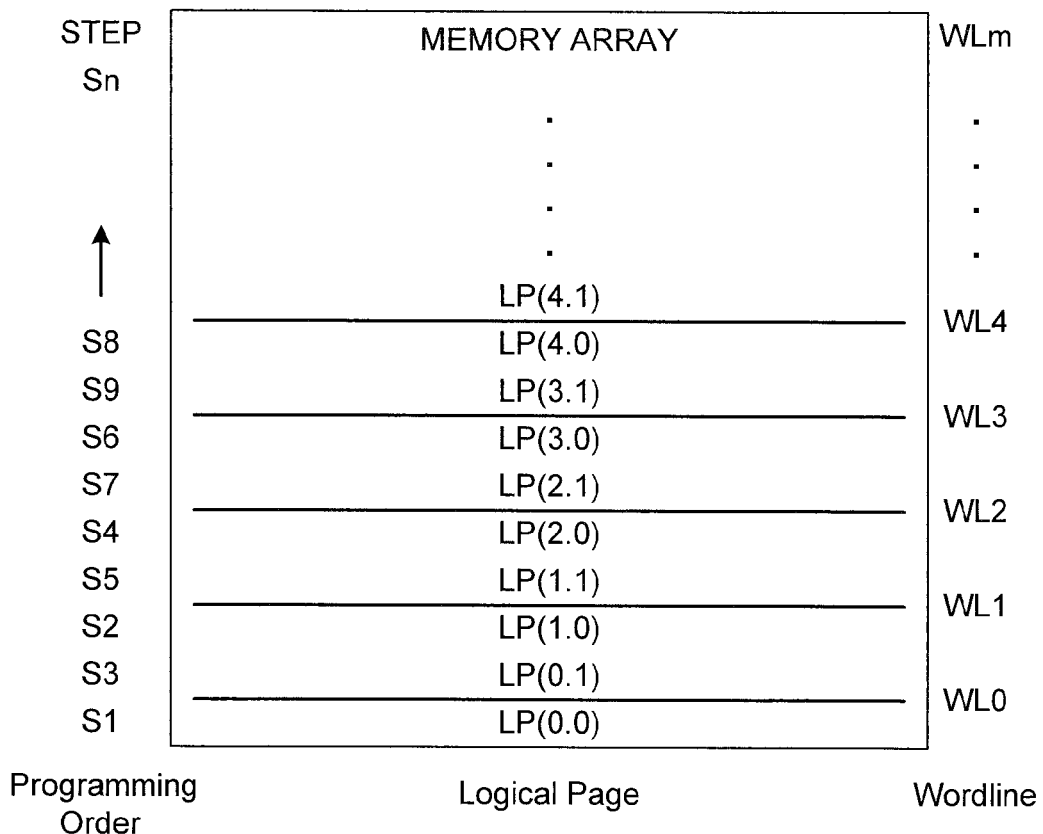
FIG. 10A illustrates an example of a memory having 2-bit memory cells (D2) and with its pages programmed in an optimal sequence so as to minimize the Yupin Effect between memory cells on adjacent word lines.
FIG. 10B illustrates another view of the programming order for the 2-bit memory of FIG. 10A.

FIG. 10A illustrates an example of a memory having 2-bit memory cells (D2) and with its pages programmed in an optimal sequence so as to minimize the Yupin Effect between memory cells on adjacent word lines. For convenience the notation is such that the physical pages P0, P1, P2, . . . reside respectively on word lines WL0, WL1, WL2, . . . For a 2-bit memory, each physical page has two logical pages associated with it, namely lower-bit and upper-bit logical pages, each with binary data. In general a particular logical page is given by LP(WL# . logical_page#). For example, the lower-bit and upper-bit pages of P0 on W0 would respectively be labeled as LP(0.0) and LP(0.1), and the corresponding ones on WL2 would be LP(2.0) and LP(2.1).

Essentially, the programming of the logical pages will follow a sequence n so that the current page being programmed will see a minimum of changes around its environment after it has been programmed. In this case, again moving incrementally in one consistent direction from bottom to top will help to eliminate perturbation from one side. Furthermore, because each physical page may have two programming passes, as the programming moves up the physical pages, it will be better for the current upper-bit page to be programmed after its adjacent lower-bit pages have already been programmed so that their perturbative effects will be accounted for when programming the current upper-bit page. Thus, if programming starts from LP(0.0) then the sequence will be as earmarked by the programming step order: S1 S2, S3, S4, S5 . . . Sn, . . . which respectively be directed to: LP(0.0), LP(1.0), LP(0.1), LP(2.0), LP(1.1), LP(3.0), LP(2.1), . . . .

FIG. 10B illustrates another view of the programming order for the 2-bit memory of FIG. 10A. In this view, it can be seen that the programming step order follows a series of diagonal, zigzag paths across the word lines in the table as it alternately transverses between the two programming passes, Lower pass and Upper pass.

Similar multi-passing programming techniques have been disclosed in U.S. Pat. No. 7,046,548, the entire disclosure of which is incorporated herein by reference.

Figure 11A:
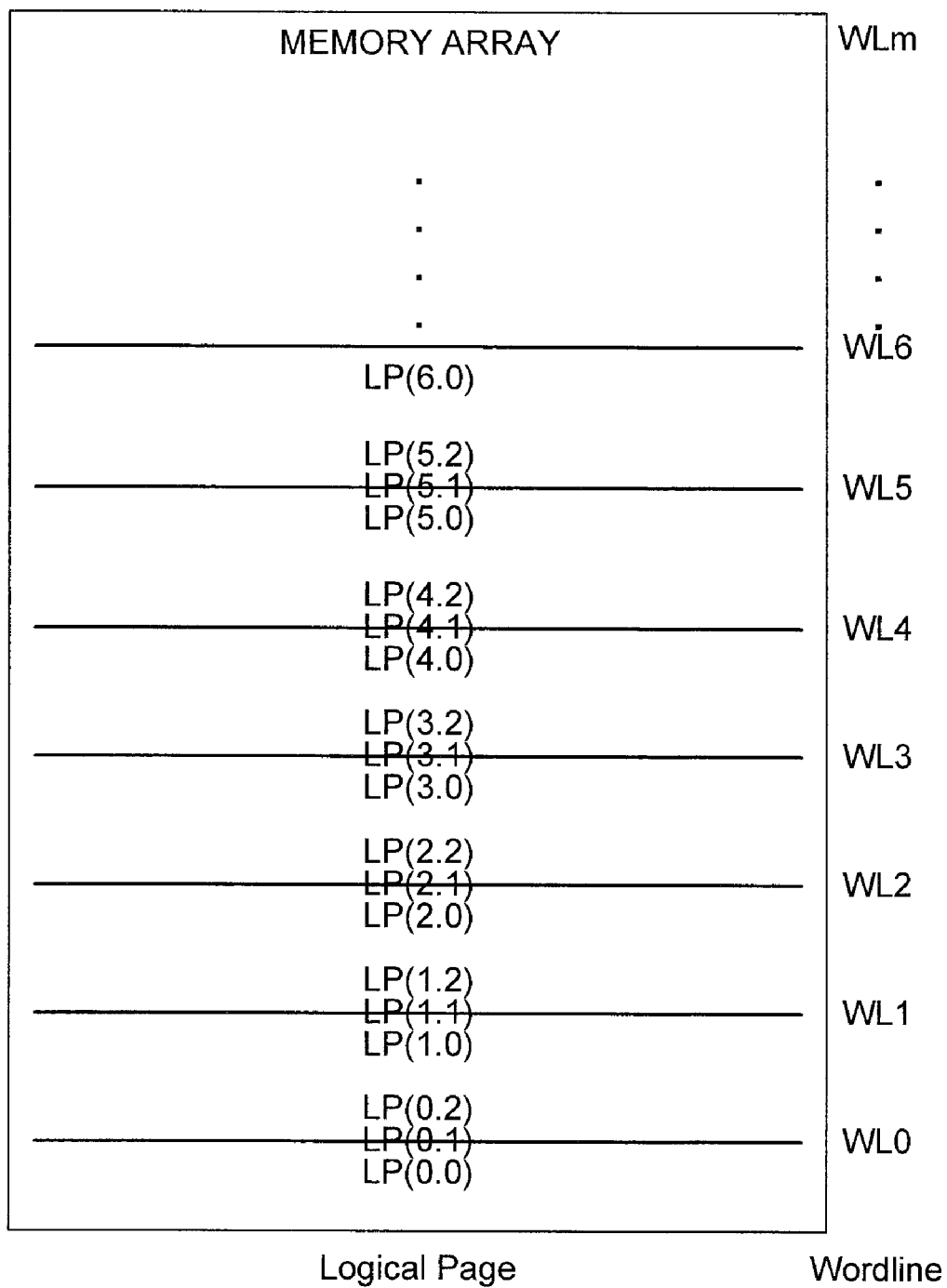
FIG. 11A illustrates an example of a memory having 3-bit memory cells (D3) where a 3-bit per cell page is programmable into each wordline.

FIG. 11A illustrates an example of a memory having 3-bit memory cells (D3) where a 3-bit per cell page is programmable into each wordline. For example, a wordline such as WL5 is linked to a group of 3-bit cells that are programmed and read in parallel. Instead of each wordline being programmed with two logical pages as in FIG. 10A, the D3 memory has each word line programmed with three logical pages. For example, the WL5 can be programmed with 3 1-bit logical pages given by LP(5.0), LP(5.1), LP(5.2).

FIG. 11B illustrates an example of a memory having 3-bit memory cells (D3) and with its pages programmed in a optimal sequence so as to minimize the Yupin effect between memory cells on adjacent word lines. The programming steps through the wordlines by meandering in a predetermined, non-sequential order. To further minimize the Yupin effect between bitlines, the three logical pages can be programmed onto WL5 by the preferred Foggy-fine multi-pass programming technique illustrated in FIG. 9. The three passes of three different types will then be: Lower pass; Foggy pass; and Fine pass. It will be seen that the logical pages associated with a given wordline are not programmed in successive steps. In other words, the three types of programming passes are not applied consecutively to the same wordline. Furthermore as described earlier in connection with FIG. 9, the Foggy-fine multi-pass programming requires data from all three pages as program target data for both the Foggy pass and the Fine pass.

FIG. 11C illustrates another view of the programming order for the 3-bit memory of FIG. 11B. In this view, the step order at which the various logical pages are programmed can be easily be constructed by a series of diagonal, zigzag paths across the word lines of the table of the view as it cycles through the three types of programming passes: Lower; Foggy; and Fine.

Address Mapping between D1 and D3

For better read performance, each triplet of logical pages on each wordline in D3 should be stored in sequential order of host data addresses. In this way, when a host reads back from D3, it can do a single read on a wordline for all three logical pages with consecutive addresses and not having to inefficiently read a single logical page from one wordline and another one from another wordline.

The non-sequential wordline programming order illustrated in FIG. 11B and FIG. 11C for minimizing WL-WL Yupin effect means that the appropriate program target data must be available when executing each programming step. In order to have the host addresses line up in each wordline in D3, the appropriate source pages also staged in D1 must be loaded into the program latches of the programming circuit before executing each step.

FIG. 12A illustrates an example of a preferred ordering of pages in sequential host addresses. This is typically the order a host would request the pages in a read.

Figure 12B:
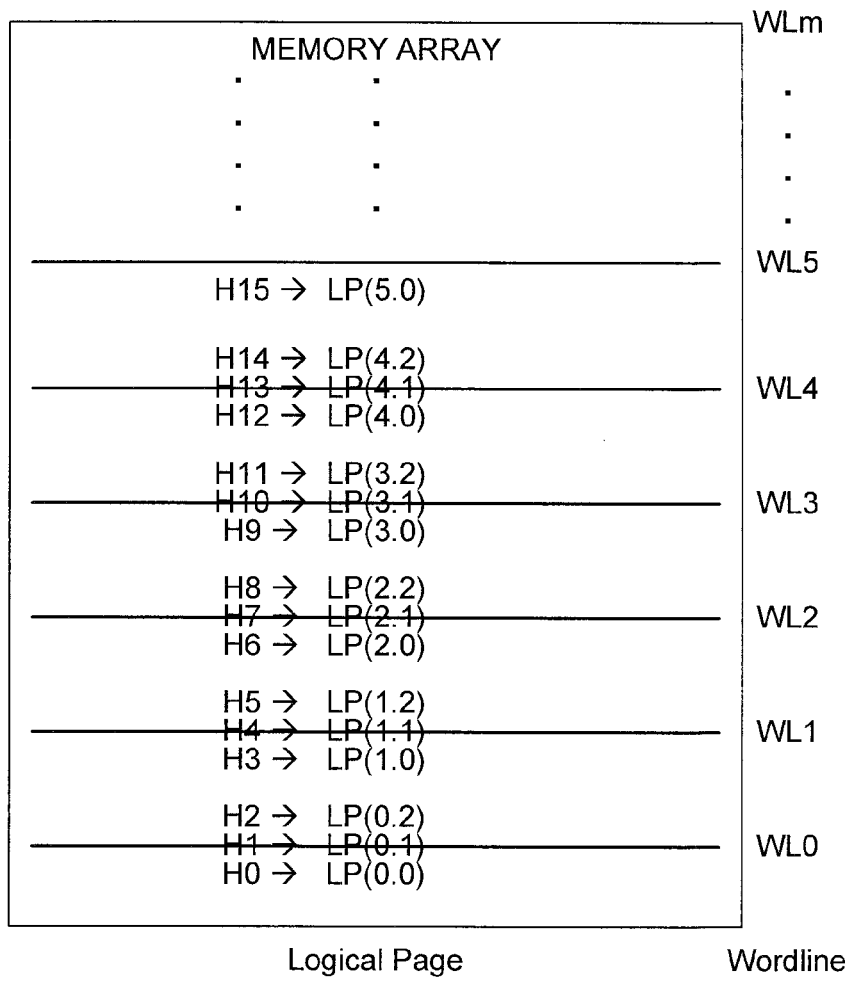
FIG. 12B illustrates a preferred storing order of the pages in D3 memory.

FIG. 12B illustrates a preferred storing order of the pages in D3 memory. For example, the pages with host addresses H0, H1, H2 are stored as lower, middle and upper logical pages in the wordline WL0, the pages H3, H4, H5 are stored similarly in WL1, etc.

As will be described later in connection with FIG. 14, the source pages are staged in a binary portion D1 of the memory before being used as program target data for programming into D3. Thus a physical-to-physical D1-to-D3 mapping is used to relate the location of the source page in D1 to where it was programmed in D3.

In a preferred implementation, the pages in D2 are also scrambled so as to ensure average charge density among the array of memory cells. This avoid irregular floating-gate to floating-gate coupling. An example of scambling the D1 pages on chip is to invert or not invert the bit value as a function of its D1 physical address. The scrambled D1 pages are then programmed into D3 according to the D1-to-D3 mapping. When they are read back from D3, their D1 addresses can be obtained by an inverse of the D1-to-D3 mapping. Once the D1 addresses are known, the inverse mapping will enable the read pages to be unscrambled.

Error Detection and Correction by Error Correction Code ("ECC")

Flash memory is prone to errors. To ensure error-free data, an error correction code ("ECC") is implemented to correct errors.

FIG. 13A illustrates schematically a data page containing an ECC field. As described in connection with FIG. 4 and FIG. 6A, a physical page of memory cells is programmed and read in parallel by virtue of a corresponding page of sense modules operating in parallel. When each memory cell stores multiple bits of data, there will be multiple data pages associated with each physical page on a wordline. The data page 70' comprises a user portion 72' and a system portion 74'. The user portion 72' is for storage of user data. The system portion 74' is generally used by the memory system for storage of system data. Included in the system data is an ECC. The ECC is computed for the data page. Typically, the ECC is computed by the ECC processor 62 in the controller 102 (see FIG. 1.) In some embodiments, when the data page is large, it can be partitioned into smaller portions, each with its own ECC.

As data is received from a host, a page of data is staged in the controller 102 and its ECC 76' is computed by the ECC processor 62. The data page incorporating the ECC is then written to the memory array 200. Typically, when the data page is read, the data page is latched in the data latches 430 and shifted out of the I/O circuits 440 to the controller 102. At the controller 102, the data page's existing ECC is compared to a second version of the ECC computed on the read data. The ECC typically includes an error detection code ("EDC") for rapid detection of any error in the data page. If the EDC indicates the existence of any error in the read data page, the ECC is invoked to correct erroneous bits in the read data page. The ECC is designed to correct up to a predetermined maximum number of errors. In practice, at any given time in the life of a memory, the ECC may have budget to correct a predetermined number of errors less than the predetermined maximum.

Error management by ECC is disclosed in U.S. application Ser. No. 12/642,728, filed on Dec. 18, 2009, entitled "NON-VOLATILE MEMORY AND METHOD WITH POST-WRITE READ AND ADAPTIVE RE-WRITE TO MANAGE ERRORS" by Dusija et al, U.S. Patent Publication No. 2011/0099460 A1; the entire disclosure of which is incorporated herein by reference.

FIG. 13B is a table illustrating the possible status of a page in D3. As described earlier, the ECC is designed to correct a predetermined number of errors in a page. The status of a page of data can be one of the following:

CECC—Correctable by ECC. The number of errors in all 3 data pages is correctable as it is within the capability of the ECC. However, the quality of the data is good only if the errors are above a predetermine threshold.

UECC—Uncorrectable by ECC. The number of errors either exceeds the capability of the ECC or above the predetermined threshold even though still correctable by ECC. The data is invalid.

Good D3 means all 3 data pages of the wordline have errors correctable by ECC and below a predetermined threshold. The data is valid.

Erased means no data page has more than a predetermined number of cells in non-erased state.

Indefinite Data in a Memory Block After a Program Abort

From the description above, it will be seen that in any partially programmed erase blocks using multi-pass programming involving the combination of the floggy-fine and also non sequential wordline programming order will at any one time result in several wordlines to have less than all three logical pages programmed. Since the foggy-fine programming requires all logical pages to be programmed to a wordline before the data is readable, if programming were to abort (e.g., due to a power failure or an unexpected disruption) in the middle of programming a block, these partially programmed wordline will be unreadable.

Partially programmed wordline will read back with Uncorrectable ECC (UECC) error after completing the first two passes for that wordline, as well as after Write Abort during any of the three passes in the foggy-fine programming scheme. This represents a problem to do partial block programming with possible power cycles between program segments, as there is no mechanism to tell if an intermediate program segment was completed normally, or there was a write abort due to sudden power loss. Thus, conventionally when a program abort occurs the data for a whole block is rewritten to a new block. Rewriting the block is time consuming. It is desirable in a programming restart to be able to continue where it was last left off on the same block without having to rewrite previously written data to a new block.

Atomic Write Sequence and Program Abort Detection

According to one aspect of the invention, a method is provided in copying data from a first portion of a memory configured for lower-bit storage to a memory block of a second portion configured for higher-bit storage. The method allows the copying operation to be broken up into multiple disjoint program segments so that restarting after each segment need not be done on a new block but continuing from where it last stopped in the block at the last segment.

The method operates in the context of multi-pass programming on each wordline in order to complete programming a multi-bit page of data thereon. The multi-pass programming is such that the data programmed is only valid after completing certain predetermined pass. At the same time, an optimum programming scheme has each programming step on a different wordline in the block according to a predetermined, non-sequential order. This results in each step performing a different type of programming pass on a different wordline from the last step. If the programming is terminated randomly at one of the programming steps in a current segment, the tereminating step block may not be discoverable in a program restart in the next segment because the read back data from several adjoining steps may share the same identifying pattern.

The method prescribes what is referred to as "atomic write sequence" in that the programming sequence in each segment is to terminate on a designated type of pass. The designated type of pass is one that would enable the terminating step to be determined unambiguously in the next segment so that the restart can continue from the last programming step.

Figure 14:
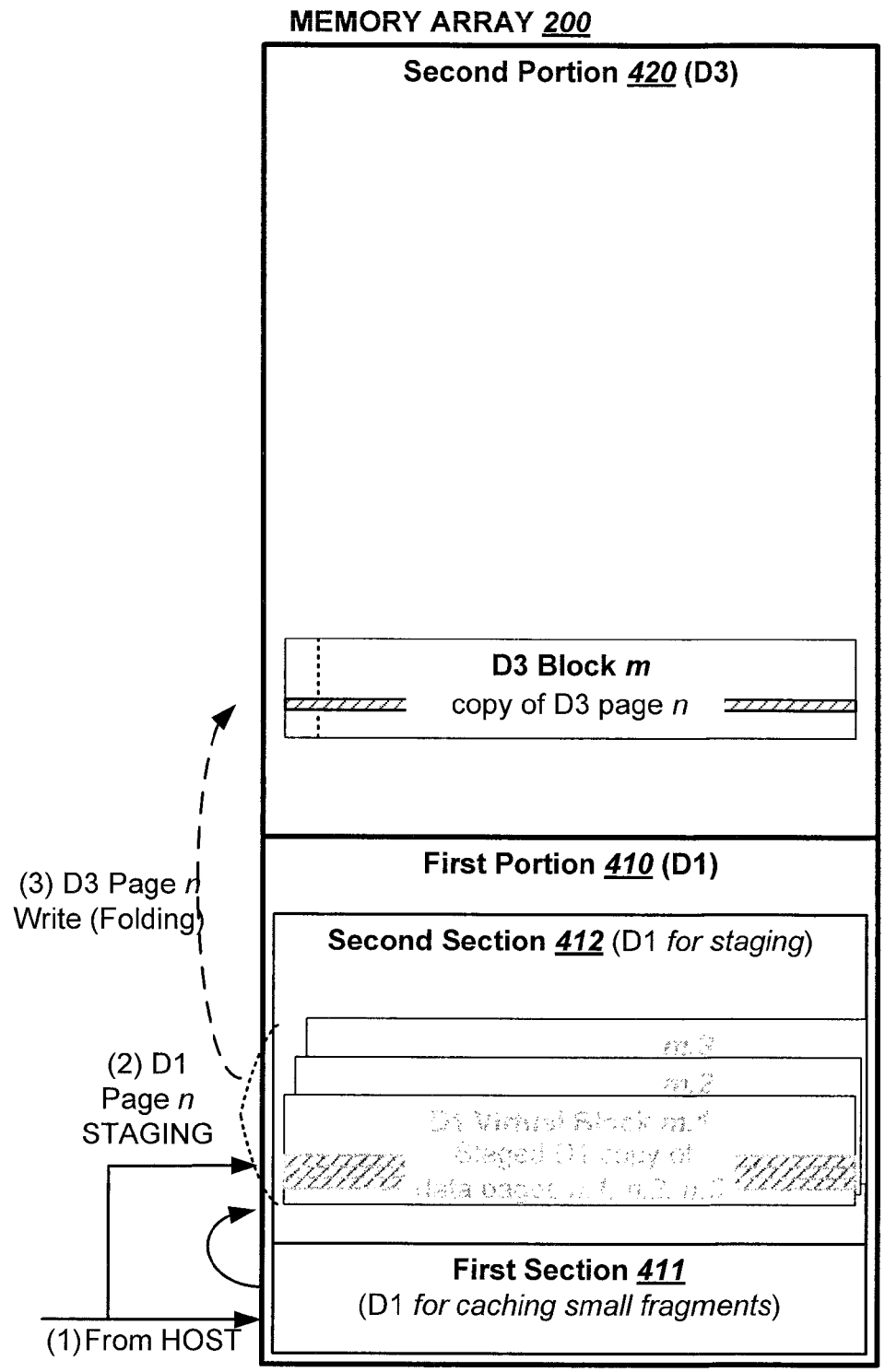
FIG. 14 illustrates an example of a memory suitable for practicing the invention.

FIG. 14 illustrates an example of a memory suitable for practicing the invention. The array of memory cells 200 (see FIG. 1) is partitioned into a first portion 410 and a second portion 420. The second portion 420 has the memory cells configured as high density storage with each cell storing multiple bits of data. The first portion 410 has the memory cells configured as lower density storage with each cell storing less number of bits than that of the second portion. For example, a memory cell in the first portion is configured to store 1 bit of data as compared to 3 bits of data in the second portion. The first portion storing 1 bit of data per cell will also be referred as D1 and the second portion storing 3 bit of data per cell as D3. In view of the discussion earlier, the first portion will operate with a much wider margin of error compared to that of the second portion. Thus, memory operations in the first portion will have less error than that in the second portion.

In one embodiment, the first portion 410 or D1 is further partitioned into a first section 411 and a second section 412.

In Step (1), during a host write, input data is either first cached in the first section 411 or written directly to the second section 412. If the input data is fragmented, it is first cached in the first section. If the input data is a substantial run of sequential data, it is written page by page directly into the second section 412.

In Step (2), in any case, the input data eventually ends up in the second section 412 where the written pages are staged into virtual D1 blocks, such as blocks m.1, m.2 and m.3. In a scheme where each block contains data from a well defined group of logical addresses, a virtual block may not correspond to a physical block but still have the group of logical addresses distributed over several physical D1 blocks.

In Step (3), as data is being written page by page into D1, when a triplet of binary pages is in D1, it can be copied to a single page with 3-bit cells in D3 in what is also referred to as folding from D1 to D3. A D3 block m is complete after the entire pages of the virtual D1 blocks m.1, m.2 and m.3 have been folded into it. The folding operation is performed by the memory as controlled by firmware 60 in the controller 102. The operation is preferably conducted in the foreground in a spare period when a host command is operating.

A memory configured with D1 and D3 portion is also disclosed in U.S. application Ser. No. 12/642,584, filed on Dec. 18, 2009, entitled "MAINTAINING UPDATES OF MULTI-LEVEL NON-VOLATILE MEMORY IN BINARY NON-VOLATILE MEMORY" by Gorobets et al, the entire disclosure of which is incorporated herein by reference.

Since the spare period in each host command may not be sufficient to complete a folding operation it is desirable to break up the folding operation into smaller segments, each segment able to be completed within the spare period of a host command. The atomic program sequence feature allows the folding to be divided into smaller segments while being able to be restarted in the next segment from the last programming step in the same block.

When a 3-pass (First, Foggy, Fine) programming is implemented to program each wordline in D3 with a 3-bit per cell page. The atomic write sequence is to terminate on a programming step for each program segment for a designated type of pass. This designated type is predetermined to allow the terminating programming step to be identifiable in a subsequent segment.

FIG. 15 illustrates the programming steps of FIG. 11B up to S10. In particular, the programming steps from S7 to S10 is as follows:

S7—a Lower Pass programming is performed on WL3;
S8—a Foggy Pass programming is performed on WL2;
S9—a Fine Pass programming is performed on WL1;
S10—another Lower Pass programming is performed on WL4.

FIGS. 16A and 16B list the effect of a write abort at various junctures of the programming steps S7-S10. This is when the 3-pass Foggy-fine programming and non-sequential wordline order features are implemented. The programming steps S7 to S9 are listed in the first row of the table in FIG. 16A. The programming step S10 is listed in the first row of the table in FIG. 16B. Along with each step is the programming pass being performed as indicated by FIG. 15.

During each programming step, the interrupt or write abort ("WA") can occur in any one of four places of each type of pass: "near the start"; "in the middle"; "near the end"; and "complete", as are listed in the second row (EVENT) of the tables in FIG. 16A and FIG. 16B.

As described before, with the Foggy-fine, 3-pass programming, data can only be read from the wordline after the Fine pass is completed. Thus as shown in FIG.16A under the "Lower, S7" column, even when the programming of a Lower pass in step S7 is completed, WL3, WL2 and WL1 are all missing at least one the passes. Therefore if data from these wordlines are read back in a restart in a next segment, they will all yield invalid data as they are uncorrectable by ECC (UECC) (see FIG. 13). The only wordline that has all three passes is WL0 and therefore it will yield good data as denoted by "Good D3". The programming step S7 has not yet visited WL5, so it is still in an erased state. Scanning back from the erased wordline, one gets an ECC signature or pattern 440 for a group of wordline as Erased, UECC, UECC, UECC, Good D3. Thus if a write abort occurs after the completion of a Lower pass at S7, the ECC signature 440 will be detected upon reading back the data of a group of wordlines from the erased Wordline in the block and the data will be invalid.

By the same analysis, the ECC signature for all the write abort events in the programming step S8 (Foggy pass) will also be the ECC signature 440 and the data is invalid.

By the same analysis, the wordline WL1 will only get its three types of pass after the programming step S9 is completed (last column). In that case, the WL1 will now yield valid data as indicated by "Good D3". Scanning back from the erased wordline, one gets an ECC signature or pattern 450 for a group of wordline as Erased, UECC, UECC, Good D3. Thus if a write abort occurs after the completion of a Fine pass at S9, a ECC signature 450 will be detected upon reading back the data of a group of wordlines from the erased Wordline in the block. A wordline with good data (e.g. WL1) is 3 wordline away from the erased WL4 and the data on WL1 will be valid.

From the description above, when scanning back a group of wordlines from the boundary between erased and programmed wordlines in a block, there will be two possible ECC signatures for the group. The signature 440 indicates the data is invalid and the write abort could have occurred during the Lower pass, the Foggy pass or even some portion of the Fine pass. However, the valid data signature 450 only appears if the write abort previous occur after the completion of the Fine pass.

There are a couple of ambiguities with the signature 450. One is that it could also mean the write abort may have occurred near the completion of the Fine pass in S9. In that case, the Fine pass is mostly done but not quite and whatever errors that result are corrected by ECC. So the data is valid but at the cost of consuming more ECC bits. In the preferred embodiment, this ambiguity can be eliminated by using a more stringent set of read demarcation points (smaller threshold) and/or monitoring if the number of error bits, even though correctable by ECC, has exceeded a predetermined threshold.

FIG. 16B is a continuation of FIG. 16A for the programming step S10. It illustrates another ambiguity with the signature 450 that it could also mean the write abort may have occurred in the next step after the Fine pass. As shown in the S10 step, the same signature 450 appears if the write abort had occurred near the start of the next Lower pass. This means S10 has proceeded somewhat with the Lower pass programming. However, it is immaterial since if S9 were identified to be the last programming step, the next restart will resume on S10, and will go on to finish the incomplete Lower pass programming.

One embodiment of the atomic program sequence will have the program sequence terminating on a Fine pass. As described above, this ensures that in a subsequent program segment the correct programming step can be identified so as to restart from. As described above, the first wordline with good data can be identified by the position of the signature relative to the boundary between the programmed and erased wordlines. For example in this case, the first good D3 is found to be WL1 and from the table in FIG. 15, it can be determined that the last programming step was S9. Thus, in the next program segment, the programming on the block can resume by starting from S10.

Another preferred embodiment of atomic write sequence is to terminate on a First pass. This is practical if the memory supports an alternative demarcation 310' (see FIG. 9) from the demarcation 310 of the normal read for reading the lower page data immediately after the Lower pass.

FIGS. 17A and 17B also list the effect of a write abort at various junctures of the programming steps S7-S10. This is when the 3-pass Foggy-fine programming and non-sequential wordline order features are implemented. The difference from FIGS. 16A and 16B is that now the memory supports the alternative demarcation 310' from normal read, thereby allowing the lower page data to be read immediately after the Lower pass.

The analysis is similar to that for FIGS. 16A and 16B. In this case, scanning back from the erased wordline, an ECC signature or pattern 460 for a group of wordline as Erased, Good LP, Good LP, UECC, Good D3 can be used to identify the completion of a Lower pass. The "Good LP" denotes that the Lower page data is valid. In particular, the signature 460 is characterized by two wordline following the erase wordline yield valid lower page data. The signature 460 only occurs when there was a program abort after a Lower pass has complete or just before or after it. This can be seen in S7, Lower pass under the "Complete" and S8, Fine "Aborted near start" in FIG. 17A and in S10, Lower pass, "Aborted near end" in FIG. 17B respectively.

In other words, the detection of the signature 460 means that write abort could have occurred in any one of three possible junctures. However, practically the abort could be regarded as being just at the completion of the Lower pass because the other two ambiguities are of little practical consequences.

This is because for the juncture just before completion of the Lower pass, the lower page data (LP) is close to being fully programmed. Whatever error that may result is corrected by the ECC. So the LP data is valid but at the cost of consuming a bit more ECC bits. In the preferred embodiment, this ambiguity can be eliminated by using a more stringent set of read demarcation points (smaller threshold) and/or monitoring if the number of error bits, even though correctable by ECC, has exceeded a predetermined threshold.

For the juncture just after completion of the Lower pass, it is already a bit into the start of the Foggy pass. If the program step is later restarted after the Lower pass, the data in the next Foggy pass will have another chance to be programmed completely.

After the programming was stopped in a last segment, the programming step last performed in the last segment is identified in the next segment, and programming is restarted by continuing from that identified last programming step.

Figure 18:
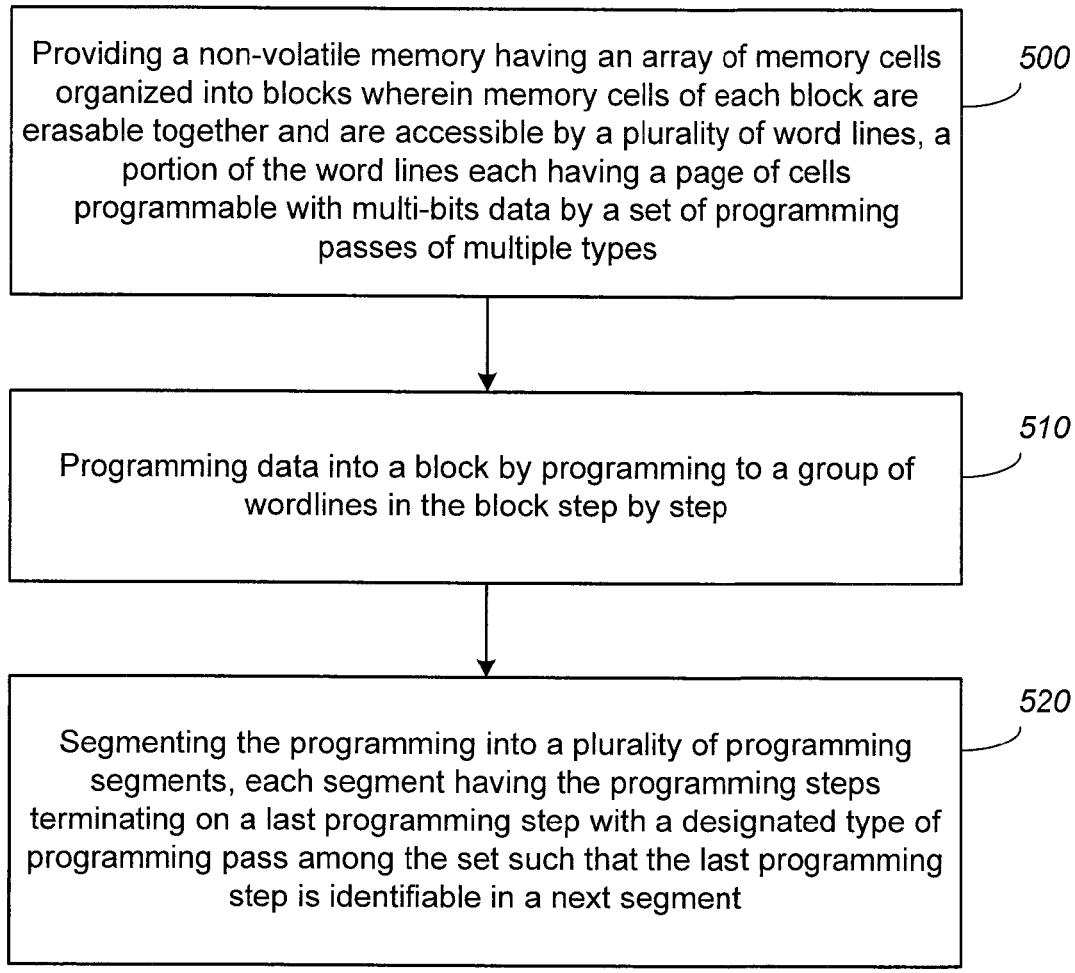
FIG. 18 is a flow diagram illustrating the atomic program sequence of the invention.

FIG. 18 is a flow diagram illustrating the atomic program sequence of the invention.

STEP 500: Providing a non-volatile memory having an array of memory cells organized into blocks wherein memory cells of each block are erasable together and are accessible by a plurality of word lines, a portion of the word lines each having a page of cells programmable with multi-bits data by a set of programming passes of multiple types.

STEP 510: Programming data into a block by programming to a group of wordlines in the block step by step.

STEP 520: Segmenting the programming into a plurality of program segments, each segment having the programming steps terminating on a last programming step with a designated type of programming pass among the set such that the last programming step is identifiable in a next segment.

According to another aspect of the invention, the last programming step performed before the programming was last stopped is identified by (1) locating a boundary between the programmed and erased wordlines in the block; (2) scanning back from the boundary toward the programmed wordlines for a group of wordlines having a predetermined ECC signature to identify a wordline that the last programming step stopped at after performing an atomic write on it. By virtue of the identified wordline and the designated end pass of the atomic write sequence, the last programming step can be identified for the restart to base on.

Figure 19:
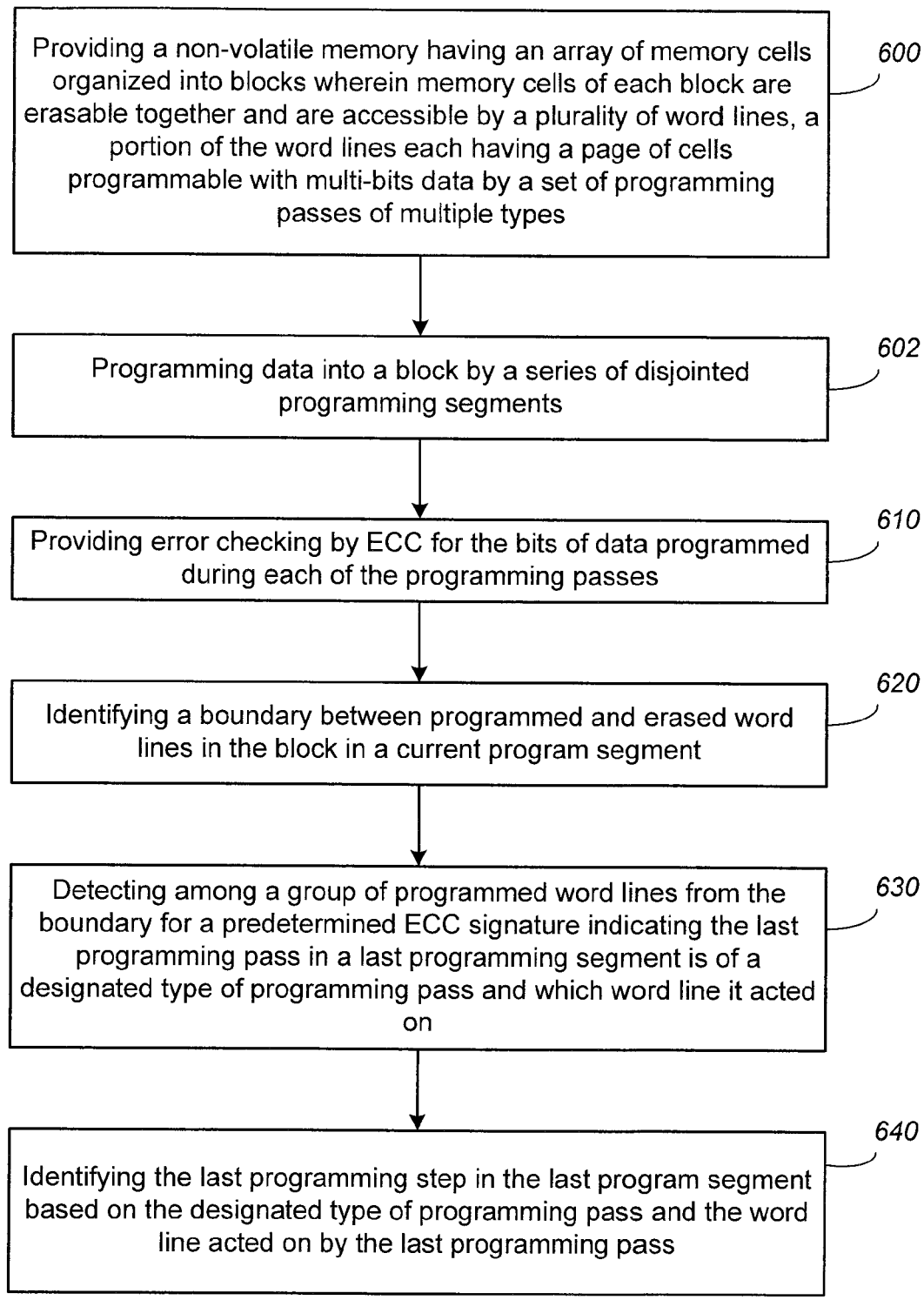
FIG. 19 is a flow diagram illustrating the discovery of the last programming step from a previous program segment.

FIG. 19 is a flow diagram illustrating the discovery of the last programming step from a previous program segment.

STEP 600: Providing a non-volatile memory having an array of memory cells organized into blocks wherein memory cells of each block are erasable together and are accessible by a plurality of word lines, a portion of the word lines each having a page of cells programmable with multi-bits data by a set of programming passes of multiple types.

STEP 602: Programming data into a block by a series of disjointed program segments.

STEP 610: Providing error checking by ECC for the bits of data programmed during each of the programming passes.

STEP 620: Identifying a boundary between programmed and erased word lines in the block in a current program segment The boundary is preferably located by a binary search. Preferably the upper page is read as it has a lower threshold 330 (see FIG. 9) just above the Erased state.

STEP 630: Detecting among a group of programmed word lines from the boundary for a predetermined ECC signature indicating whether the last programming pass in a last program segment ended is of a designated type of programming pass and which wordline acted on by the last programming pass. Each wordline to be scanned will be detected as either "UECC" or with good data. The initial detection is preferably done by read the middle page (in theory, upper page read would be best, but as described below, there is a possibility of CECC when reading upper page on a wordline with only First pass.

In the example for D3 when the atomic write sequence is terminating on a Fine pass as illustrated in FIG. 16A and FIG. 16B, the detection needs only distinguish between the two ECC signatures 440 and 450. The difference is that the ECC signature 440 (Write Abort) has a third wordline from the erased exhibiting "UECC" while the ECC signature 450 (Complete Atomic Write terminating on a Fine pass) has the third wordline exhibiting good data for all three logical page ("Good D3"). Thus a quick detection in this case is simply to locate the erased wordline at the boundry, go from there to the third programmed wordline and read and check to see if its ECC is "UECC" (Write Abort) or "Good D3" (Complete Atomic Write).

The detection of "Good D3" is preferably performed by reading under a more stringent set of read thresholds. before the read data is checked with ECC. All three (lower, middle and upper) pages of the wordline are checked.

STEP 640: Identifying the last programming step in a last program segment based on the the designated pass type and the word line the pass acted on The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. In a non-volatile memory having an array of memory cells organized into blocks wherein memory cells of each block are erasable together and are accessible by a plurality of word lines, a portion of the wordlines each having a page of cells programmable with multi-bits data by a set of programming passes of multiple types, a method of programming data into a block, comprising:
   programming data into a block by programming to a group of wordlines in the block step by step; and
   segmenting the programming into a plurality of program segments, each segment having the programming steps terminating on a terminating programming step with a designated type of programming pass among the set such that the terminating programming step is discoverable in a next segment; and
   wherein there are three passes in the set of programming passes.

2. In a non-volatile memory having an array of memory cells organized into blocks wherein memory cells of each block are erasable together and are accessible by a plurality of word lines, a portion of the wordlines each having a page of cells programmable with multi-bits data by a set of programming passes of multiple types, a method of programming data into a block, comprising:
   programming data into a block by programming to a group of wordlines in the block step by step; and
   segmenting the programming into a plurality of program segments, each segment having the programming steps terminating on a terminating programming step with a designated type of programming pass among the set such that the terminating programming step is discoverable in a next segment; and
   wherein said programming has each step at a different wordline among the group according to a predetermined, non-sequential order and operating a programming pass different from a previous step.

3. In a non-volatile memory having an array of memory cells organized into blocks wherein memory cells of each block are erasable together and are accessible by a plurality of word lines, a portion of the wordlines each having a page of cells programmable with multi-bits data by a set of programming passes of multiple types, a program operation on a block being segmented into a series of disjointed program segments, a method of identifying a last programming step in a last program segment, comprising:
   providing error checking on data programmed to each group of memory cells on a wordline;
   identifying a boundary between programmed and erased word lines in the block in a current program segment;
   detecting among a group of programmed word lines from the boundary for a predetermined ECC signature indicating the last programming pass in a last program segment is of a designated type of programming pass and which word line it acted on; and
   identifying the last programming step in the last program segment based on the designated type of programming pass and the word line acted on by the last programming pass.

4. The method as in claim 3, wherein:
   said identifying a boundary between programmed and erased word lines in the block comprises binary searching the block.

5. The method as in claim 3, wherein:
   the program operation comprises a series of programming steps that operates on the wordlines in the block according to a predetermined, non-sequential order.

6. The method as in claim 3, wherein:
   each wordline is programmable with three 1 bit per cell data pages.

7. A non-volatile memory, comprising:
   an array of memory cells organized into blocks wherein memory cells of each block are erasable together and are accessible by a plurality of word lines
   a portion of the wordlines each having a page of cells programmable with multi-bits data by a set of programming passes of multiple types;
   a controller for operating a program operation, said program operation further comprising:
   programming data into a block by programming to a group of wordlines in the block step by step; and
   segmenting the programming into a plurality of program segments, each segment having the programming steps terminating on a terminating programming step with a designated type of programming pass among the set such that the terminating programming step is discoverable in a next segment; and
   wherein there are three passes in the set of programming passes.

8. A non-volatile memory, comprising:

an array of memory cells organized into blocks wherein memory cells of each block are erasable together and are accessible by a plurality of word lines;

a portion of the wordlines each having a page of cells programmable with multi-bits data by a set of programming passes of multiple types;

a controller for operating a program operation, said program operation further comprising:

programming data into a block by programming to a group of wordlines in the block step by step; and segmenting the programming into a plurality of program segments, each segment having the programming steps terminating on a terminating programming step with a designated type of programming pass among the set such that the terminating programming step is discoverable in a next segment; and wherein said programming has each step at a different wordline among the group according to a predetermined, non-sequential order and operating a programming pass different from a previous step.

9. A non-volatile memory, comprising:

an array of memory cells organized into blocks wherein memory cells of each block are erasable together and are accessible by a plurality of word lines;

a portion of the wordlines each having a page of cells programmable with multi-bits data by a set of programming passes of multiple types;

a controller for:

controlling a program operation on a block, the program operation being segmented into a series of disjointed program segments;

providing error checking on data programmed to each group of memory cells on a wordline;

identifying a boundary between programmed and erased word lines in the block in a current program segment;

detecting among a group of programmed word lines from the boundary for a predetermined ECC signature indicating the last programming pass in a last program segment is of a designated type of programming pass and which word line it acted on; and identifying the last programming step in the last program segment based on the designated type of programming pass and the word line acted on by the last programming pass.

10. The non-volatile memory as in claim 9, wherein:

said identifying a boundary between programmed and erased word lines in the block comprises binary searching the block.

11. The non-volatile memory as in claim 9, wherein:

the program operation comprises a series of programming steps that operates on the wordlines in the block according to a predetermined, non-sequential order.

12. The non-volatile memory as in claim 9, wherein:

each wordline is programmable with three 1 bit per cell data pages.

13. The non-volatile memory as in any one of claims 7-12, wherein the non-volatile memory is flash memory.

* * * * *